(12) United States Patent
Kuriki

(10) Patent No.: US 8,722,314 B2
(45) Date of Patent: May 13, 2014

(54) METHOD FOR PRODUCING CONDUCTIVE SHEET AND METHOD FOR PRODUCING TOUCH PANEL

(75) Inventor: Tadashi Kuriki, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 299 days.

(21) Appl. No.: 13/117,927

(22) Filed: May 27, 2011

(65) Prior Publication Data

US 2011/0289771 A1  Dec. 1, 2011

(30) Foreign Application Priority Data

May 28, 2010  (JP) .................................. 2010-122747
Mar. 30, 2011 (JP) .................................. 2011-074531

(51) Int. Cl.
*G03F 7/00* (2006.01)

(52) U.S. Cl.
USPC ........................................................ 430/320

(58) Field of Classification Search
USPC .................. 430/311, 320, 401, 449
See application file for complete search history.

(56) References Cited

U.S. PATENT DOCUMENTS

| 7,449,286 B2* | 11/2008 | Winscom et al. ............. 430/449 |
| 7,563,564 B2* | 7/2009 | Brooks et al. .................. 430/401 |
| 2007/0059646 A1* | 3/2007 | Winscom et al. ............. 430/311 |
| 2008/0206689 A1* | 8/2008 | Brooks et al. .................. 430/401 |

FOREIGN PATENT DOCUMENTS

| JP | 2008-129708 | 6/2008 |
| JP | 2008-158108 | 7/2008 |

* cited by examiner

*Primary Examiner* — Stewart Fraser
(74) *Attorney, Agent, or Firm* — Young & Thompson

(57) ABSTRACT

A first exposure treatment for irradiating a first photosensitive layer formed on one main surface of a transparent support with a first light thereby to expose the first photosensitive layer and a second exposure treatment for irradiating a second photosensitive layer formed on the other main surface of the transparent support with a second light to expose the second photosensitive layer are performed such that the first light incident on the first photosensitive layer does not substantially reach the second photosensitive layer and the second light incident on the second photosensitive layer does not substantially reach the first photosensitive layer.

18 Claims, 19 Drawing Sheets

METHOD FOR PRODUCING CONDUCTIVE SHEET AND METHOD FOR PRODUCING TOUCH PANEL

CROSS-REFERENCE TO RELATED APPLICATION

This application is based upon and claims the benefit of priority from Japanese Patent Applications No. 2010-122747 filed on May 28, 2010 and No. 2011-074531 filed on Mar. 30, 2011, of which the contents are incorporated herein by reference.

BACKGROUND OF THE INVENTION

1. Field of the Invention

The present invention relates to a method for producing a conductive sheet (for example suitable for use in a projected capacitive touch panel) and a method for producing a touch panel.

2. Description of the Related Art

Conventional methods for forming a high-resolution conductive pattern on each side of a support include a method described in Japanese Laid-Open Patent Publication No. 2008-158108.

The method disclosed in Japanese Laid-Open Patent Publication No. 2008-158108 employs a photosensitive material having a transparent support, a photosensitive silver halide emulsion layer formed on one side (an A side) of the support, and another photosensitive silver halide emulsion layer formed on the other side (a B side) of the support, and contains the steps of irradiating only the A side with a light in a pattern and developing the exposed material to form an image in the same position on each side of the transparent support.

Conventional capacitive touch panels are position input devices capable of sensing change in an electrostatic capacitance between a human finger and a conductive film to detect the position touched by the fingertip. Such capacitive touch panels include surface capacitive touch panels and projected capacitive touch panels. The surface capacitive touch panel has a simple structure but is incapable of simultaneously detecting two or more touch points (multi-touch detection). On the other hand, the projected capacitive touch panel has a structure containing a large number of electrodes arranged in a matrix, similar to a pixel structure of a liquid crystal display device, etc. More specifically, the structure is such that a plurality of electrodes are arranged in the vertical direction and connected in series to form a first electrode array, a plurality of the first electrode arrays are arranged in the horizontal direction, a plurality of electrodes are arranged in the horizontal direction and connected in series to form a second electrode array, a plurality of the second electrode arrays are arranged in the vertical direction, and capacitance changes are sequentially detected by the first and second electrode arrays to achieve multi-touch detection.

Such conventional projected capacitive touch panels include a capacitive input device described in Japanese Laid-Open Patent Publication No. 2008-129708. In this capacitive input device, transparent electrode wires d1 are disposed as a dummy electrode D1 in spaces S1, S2 between a common electrode c1 and X-detecting electrodes x1 and x2 on an upper electrode substrate, and transparent electrode wires d2 are disposed as a dummy electrode D2 in a space S3 between adjacent Y-detecting electrodes yn on a lower electrode substrate, whereby the contrast difference is reduced between a region containing the common electrode c1, the X-detecting electrodes xb, and the Y-detecting electrodes yn and a region containing only the dummy electrodes D1, D2. Thus, when the transparent touch panel is observed from the outside, the inside transparent electrode wires are less visible.

As described above, the method described in Japanese Laid-Open Patent Publication No. 2008-158108 is suitable for forming the same pattern in the same position on each side of the transparent support. However, the method is not suitable for forming a different conductive pattern on each side to obtain the projected capacitive touch panel described in Japanese Laid-Open Patent Publication No. 2008-129708.

The reason for being not suitable is as follows: In the above method, when the A and B sides of the transparent support are exposed in different patterns, the exposure pattern on the A side is formed also on the B side, and similarly the exposure pattern on the B side is formed also on the A side. As a result, the A and B sides have the same pattern.

In addition, in the touch panel described in Japanese Laid-Open Patent Publication No. 2008-129708, for example in terminal patterns on the lower electrode substrate shown in FIG. 3 of the patent document, the terminal pattern corresponding to the electrode y1 that is farthest from the wire assembly of the terminal patterns is longer than the other terminal patterns, and the terminal pattern corresponding to the electrode y16 that is closest to the wire assembly is shorter than the other terminal patterns. Therefore, disadvantageously, the RC time constants of the electrode y1 and the electrodes arranged therearound are increased, and the detection voltage waveform is distorted, so that it is difficult to perform the position detection within a predetermined operation time (a scan time). This problem is caused particularly in a larger touch panel, and thus the screen sizes (not the thickness but the length and width) only can be increased to a limited extent.

SUMMARY OF THE INVENTION

In view of the above problems, an object of the present invention is to provide a method for producing a conductive sheet, capable of forming the same or different patterns on each side of a photosensitive material having a transparent support in an exposure treatment, simplifying a conductive sheet production process, easily forming an electrode for a touch panel or the like, and making the touch panel or the like thinner (smaller).

Another object of the present invention is to provide a method for producing a touch panel, utilizing the above conductive sheet production method, and which is capable of producing a thinner touch panel, reducing the time constant of an electrode in the conductive sheet, and increasing the screen size of the touch panel.

[1] A method for producing a conductive sheet according to a first aspect of the present invention, comprising the steps of exposing and developing a photosensitive material having a transparent support, a first photosensitive layer formed on one main surface of the transparent support, and a second photosensitive layer formed on the other main surface of the transparent support, wherein the exposing step includes a first exposure treatment for irradiating the first photosensitive layer on the transparent support with a light thereby to expose the first photosensitive layer and a second exposure treatment for irradiating the second photosensitive layer on the transparent support with a light thereby to expose the second photosensitive layer, and the exposing step is performed such that the light incident on the first photosensitive layer does not substantially reach the second photosensitive layer and the light incident on the second photosensitive layer does not substantially reach the first photosensitive layer.

[2] The method according to the first aspect, wherein the first exposure treatment for the first photosensitive layer and the second exposure treatment for the second photosensitive layer are simultaneously carried out.

[3] The method according to the first aspect, wherein an image formation on the first photosensitive layer is controlled at least by selecting the sensitivity of the second photosensitive layer, and an image formation on the second photosensitive layer is controlled at least by selecting the sensitivity of the first photosensitive layer.

[4] The method according to the first aspect, wherein the first photosensitive layer contains a material having a light absorption sensitivity in the wavelength range of the light incident thereon, and the second photosensitive layer contains a material having a light absorption sensitivity in the wavelength range of the light incident thereon.

[5] The method according to the first aspect, wherein the first photosensitive layer contains a first photosensitive silver halide emulsion layer, the second photosensitive layer contains a second photosensitive silver halide emulsion layer, the image formation on the first photosensitive layer is controlled at least by selecting an applied silver amount of the second photosensitive silver halide emulsion layer, and the image formation on the second photosensitive layer is controlled at least by selecting an applied silver amount of the first photosensitive silver halide emulsion layer.

[6] The method according to the first aspect, wherein the first photosensitive layer contains a first photosensitive silver halide emulsion layer, the second photosensitive layer contains a second photosensitive silver halide emulsion layer, the image formation on the first photosensitive layer is controlled at least by selecting a light absorbance of a coloring matter contained in the second photosensitive silver halide emulsion layer, and the image formation on the second photosensitive layer is controlled at least by selecting a light absorbance of a coloring matter contained in the first photosensitive silver halide emulsion layer.

[7] The method according to the first aspect, wherein the first photosensitive layer contains a first photosensitive silver halide emulsion layer, the second photosensitive layer contains a second photosensitive silver halide emulsion layer, the image formation on the first photosensitive layer is controlled at least by selecting an applied silver amount of the second photosensitive silver halide emulsion layer and a light absorbance of a coloring matter contained in the second photosensitive silver halide emulsion layer, and the image formation on the second photosensitive layer is controlled at least by selecting an applied silver amount of the first photosensitive silver halide emulsion layer and a light absorbance of a coloring matter contained in the first photosensitive silver halide emulsion layer.

[8] The method according to the first aspect, wherein no antihalation layers are provided, and the first and second photosensitive silver halide emulsion layers each have an applied silver amount of 5 to 30 g/m$^2$.

[9] The method according to the first aspect, wherein the first photosensitive layer contains a first photosensitive silver halide emulsion layer and a first antihalation layer formed between the first photosensitive silver halide emulsion layer and the transparent support, the second photosensitive layer contains a second photosensitive silver halide emulsion layer and a second antihalation layer formed between the second photosensitive silver halide emulsion layer and the transparent support, the image formation on the first photosensitive layer is controlled at least by selecting a light absorbance of a coloring matter contained in each of the first and second antihalation layers, and the image formation on the second photosensitive layer is controlled at least by selecting a light absorbance of a coloring matter contained in each of the first and second antihalation layers.

[10] The method according to the first aspect, wherein the first photosensitive layer contains a first photosensitive silver halide emulsion layer and a first antihalation layer formed between the first photosensitive silver halide emulsion layer and the transparent support, the second photosensitive layer contains a second photosensitive silver halide emulsion layer and a second antihalation layer formed between the second photosensitive silver halide emulsion layer and the transparent support, the image formation on the first photosensitive layer is controlled at least by selecting an applied silver amount of the second photosensitive silver halide emulsion layer and a light absorbance of a coloring matter contained in each of the first and second antihalation layers, and the image formation on the second photosensitive layer is controlled at least by selecting an applied silver amount of the first photosensitive silver halide emulsion layer and a light absorbance of a coloring matter contained in each of the first and second antihalation layers.

[11] The method according to the first aspect, wherein the first and second photosensitive silver halide emulsion layers each have an applied silver amount of 3 to 30 g/m$^2$.

[12] The method according to the first aspect, wherein the first and second photosensitive silver halide emulsion layers each have an applied silver amount of less than 15 g/m$^2$, and the first and second antihalation layers each have an applied coloring matter amount of 50 to 250 mg/m$^2$.

[13] The method according to the first aspect, wherein the first and second antihalation layers each have an applied coloring matter amount of 70 to 200 mg/m$^2$.

[14] The method according to the first aspect, wherein the coloring matter has a light absorbance of 0.1 to 1.5 (no unit).

[15] A method for producing a touch panel according to a second aspect of the present invention, the touch panel containing a conductive sheet having a transparent support, a first conductive layer formed on one main surface of the transparent support, and a second conductive layer formed on the other main surface of the transparent support, comprising the exposure step of exposing a photosensitive material having the transparent support, a first photosensitive layer formed on the one main surface of the transparent support, and a second photosensitive layer formed on the other main surface of the transparent support, and the development step of developing the exposed photosensitive material thereby to make the first and second photosensitive layers into the first and second conductive layers respectively, wherein the exposure step includes a first exposure treatment for irradiating the first photosensitive layer on the transparent support with a light thereby to expose the first photosensitive layer and a second exposure treatment for irradiating the second photosensitive layer on the transparent support with a light thereby to expose the second photosensitive layer, and the exposure step is performed such that the light incident on the first photosensitive layer does not substantially reach the second photosensitive layer and the light incident on the second photosensitive layer does not substantially reach the first photosensitive layer.

[16] The method according to the second aspect, wherein the first conductive layer has a large number of first conductive patterns arranged in a first direction and a large number of first terminal wiring patterns connected to the first conductive patterns, the second conductive layer has a large number of second conductive patterns arranged in a second direction perpendicular to the first direction and a large number of second terminal wiring patterns connected to the second conductive patterns, and the first and second conductive patterns are alternately arranged in a sensing region, the first terminal wiring patterns are arranged in a first terminal wiring region, and the second terminal wiring patterns are arranged in a second terminal wiring region.

[17] The method according to the second aspect, further comprising the step of bending the first and second terminal wiring regions toward the back side of the sensing region.

[18] The method according to the second aspect, wherein in the first terminal wiring region, the length of a portion in which the first terminal wiring patterns extend to the outside is smaller than the length of a portion in which the first terminal wiring patterns are connected to the first conductive patterns, and the first terminal wiring patterns corresponding to both the left and right first conductive patterns that are farthest from the center of the arrangement of the first conductive patterns have approximately the same lengths; and in the second terminal wiring region, the length of a portion in which the second terminal wiring patterns extend to the outside is smaller than the length of a portion in which the second terminal wiring patterns are connected to the second conductive patterns, and the second terminal wiring patterns corresponding to both the left and right second conductive patterns that are farthest from the center of the arrangement of the second conductive patterns have approximately the same lengths.

[19] The method according to the second aspect, wherein the first conductive patterns each contain two or more first conductive large lattices and a first connection for electrically connecting the adjacent first large lattices, the second conductive patterns each contain two or more second conductive large lattices and a second connection for electrically connecting the adjacent second large lattices, the first and second large lattices each contain a combination of two or more small lattices, the first and second conductive patterns each have a line width of 1 to 20 µm, and the small lattices each have a side length of 50 to 500 µm.

As described above, in the conductive sheet production method of the present invention, the same or different patterns can be formed on each side (each of front and back sides) of the photosensitive material having the transparent support with excellent position accuracy in accordance with the intended use by exposing the photosensitive material, an electrode for a touch panel or the like can be easily formed, and the touch panel or the like can be made thinner (smaller).

Furthermore, in the touch panel production method of the present invention, using the above conductive sheet production method, the touch panel can be produced with a smaller thickness, the time constant of an electrode in the conductive sheet can be reduced, and the screen size of the touch panel can be increased.

The above and other objects features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Several embodiments of a conductive sheet production method and a touch panel production method according to the present invention will be described below with reference to FIGS. 1 to 19B. It should be noted that, in this description, a numeric range of "A to B" includes both the numeric values A and B as the lower limit and upper limit values.

The conductive sheet production method according to an embodiment of the present invention will be described below with reference to FIGS. 1 to 7.

Figure 1:
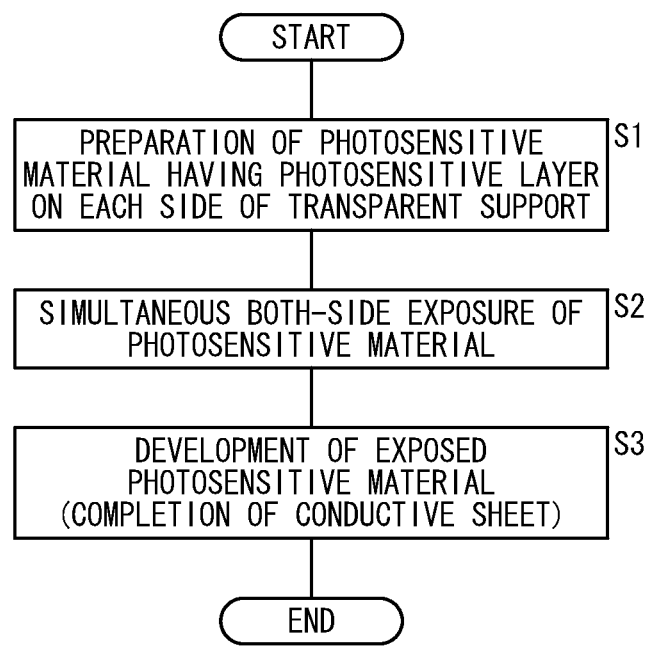
FIG. 1 is a flow chart of a method for producing a conductive sheet according to an embodiment of the present invention.
Figure 2A:
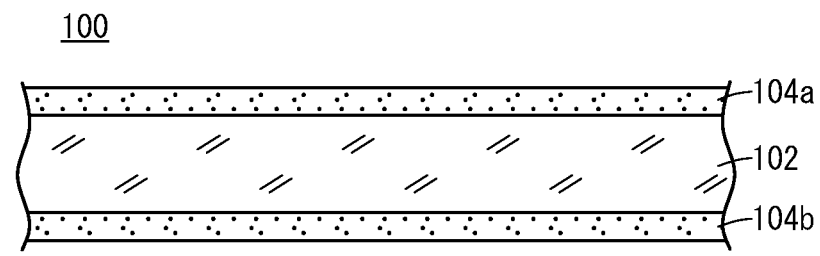
FIG. 2A is a cross-sectional view partially showing a prepared photosensitive material.

First, in step S1 of FIG. 1, a long photosensitive material 100 is prepared. As shown in FIG. 2A, the photosensitive material 100 has a transparent support 102, a first photosensitive layer 104a formed on one main surface of the transparent support 102, and a second photosensitive layer 104b formed on the other main surface of the transparent support 102.

Figure 2B:
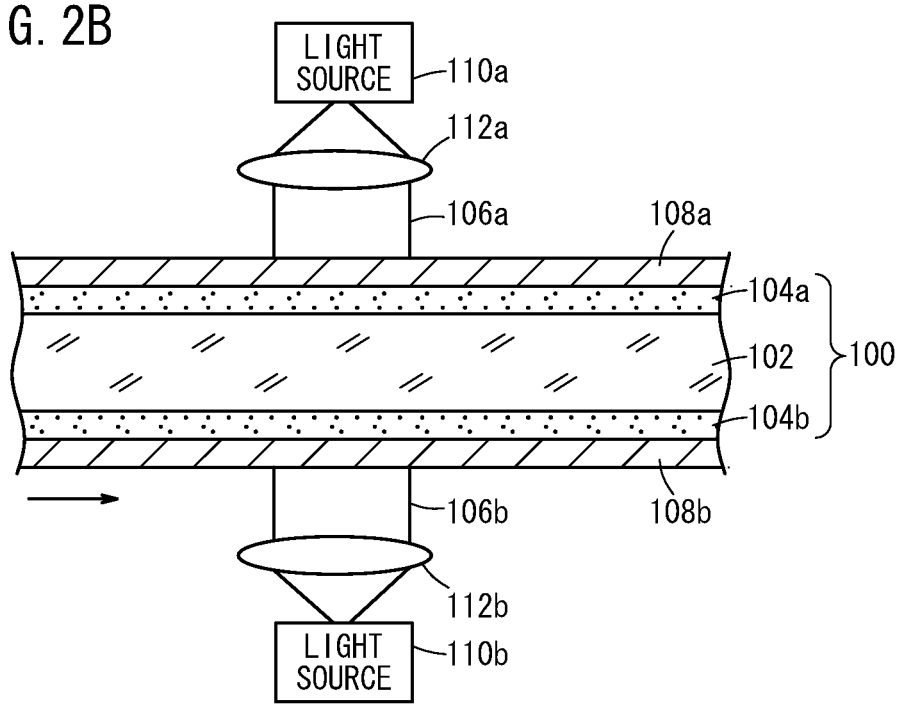
FIG. 2B is an explanatory view showing a simultaneous both-side exposure of the photosensitive material.

In step S2 of FIG. 1, the photosensitive material 100 is exposed. In this exposure step, as shown in FIG. 2B, a simultaneous both-side exposure, which includes a first exposure treatment for irradiating the one main surface of the transparent support 102 with light to expose the first photosensitive layer 104a in a first exposure pattern and a second exposure treatment for irradiating the other main surface of the transparent support 102 with light to expose the second photosensitive layer 104b in a second exposure pattern, is carried out. In the example of FIG. 2B, the first photosensitive layer 104a is irradiated through a first photomask 108a with a first light 106a (a parallel light), and the second photosensitive layer 104b is irradiated through a second photomask 108b with a second light 106b (a parallel light), while the long photosensitive material 100 is conveyed in one direction. The first light 106a is obtained by converting light from a first light source 110a into the parallel light through an intermediate first collimator lens 112a, and the second light 106b is obtained by converting light from a second light source 110b into the parallel light through an intermediate second collimator lens 112b. Though the two light sources (the first light source 110a and the second light source 110b) are used in the example of FIG. 2B, the exposure can be performed using only one light source. In this case, light from the one light source is divided by an optical system into the first light 106a and the second light 106b with which the first photosensitive layer 104a and the second photosensitive layer 104b are irradiated.

Figure 2C:
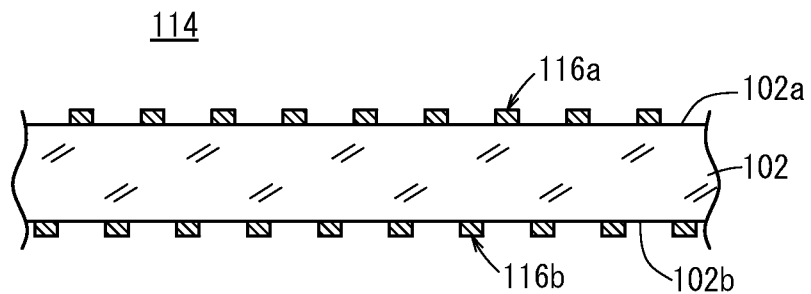
FIG. 2C is a cross-sectional view partially showing a conductive sheet produced by developing the exposed photosensitive material.

In step S3 of FIG. 1, the exposed photosensitive material 100 is developed to produce a conductive sheet 114 shown in FIG. 2C. The conductive sheet 114 has the transparent support 102, a first conductive layer 116a formed in the first exposure pattern on the one main surface of the transparent support 102, and a second conductive layer 116b formed in the second exposure pattern on the other main surface of the transparent support 102. Preferred exposure time and development time for the first photosensitive layer 104a and the second photosensitive layer 104b depend on the types of the first light source 110a and the second light source 110b, and the type of developer, etc., and thus cannot be categorically determined. The exposure time and development time may be selected in view of achieving a development ratio of 100%.

The first conductive layer 116a and the second conductive layer 116b may be subjected to a physical development treatment and/or a plating treatment to deposit a conductive metal thereon.

Figure 3:
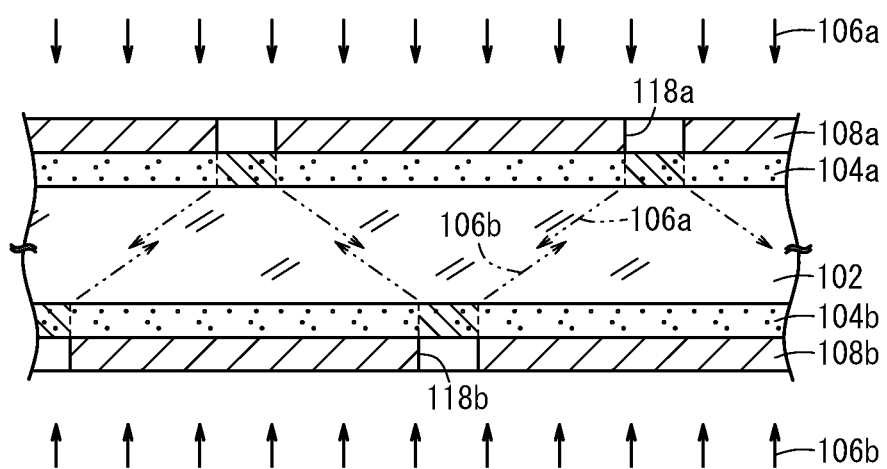
FIG. 3 is an explanatory view showing first and second exposure treatments performed such that a light incident on a first photosensitive layer does not reach a second photosensitive layer and a light incident on the second photosensitive layer does not reach the first photosensitive layer.

As shown in FIG. 3, in the first exposure treatment in the production method of this embodiment, for example, the first photomask 108a is placed in close contact with the first photosensitive layer 104a, and the first light source 110a is arranged so as to face the first photomask 108a. Then, the first light 106a is emitted from the first light source 110a toward the first photomask 108a, so that the first photosensitive layer 104a is exposed. The first photomask 108a has a glass substrate composed of a transparent soda glass and a mask pattern (a first exposure pattern 118a) formed thereon. Therefore, in the first exposure treatment, areas in the first photosensitive layer 104a that correspond to the first exposure pattern 118a in the first photomask 108a, are exposed. A space of approximately 2 to 10 μm may be formed between the first photosensitive layer 104a and the first photomask 108a.

Similarly, in the second exposure treatment, for example, the second photomask 108b is placed in close contact with the second photosensitive layer 104b, and the second light source 110b is arranged so as to face the second photomask 108b. Then, the second light 106b is emitted from the second light source 110b toward the second photomask 108b, so that the second photosensitive layer 104b is exposed. The second photomask 108b, as well as the first photomask 108a, has a glass substrate composed of a transparent soda glass and a mask pattern (a second exposure pattern 118b) formed thereon. Therefore, in the second exposure treatment, areas in the second photosensitive layer 104b that correspond to the second exposure pattern 118b in the second photomask 108b, are exposed. In this case, a space of approximately 2 to 10 μm may be formed between the second photosensitive layer 104b and the second photomask 108b.

In the first and second exposure treatments, the emission of the first light 106a from the first light source 110a and the emission of the second light 106b from the second light source 110b may be carried out simultaneously or separately. When the emissions are simultaneously carried out, the first photosensitive layer 104a and the second photosensitive layer 104b can be simultaneously exposed in one exposure step thereby to reduce the exposure time.

In this embodiment, as shown in FIG. 3, the exposure step is performed such that the first light 106a emitted from the first light source 110a to the first photosensitive layer 104a does not substantially reach the second photosensitive layer 104b and the second light 106b emitted from the second light source 110b to the second photosensitive layer 104b does not substantially reach the first photosensitive layer 104a. The term "the light does not substantially reach the photosensitive layer" means that the light does not reach the photosensitive layer or that the light only reaches the photosensitive layer in such a small light amount that an image is not formed in the development step. Thus, the term "the light reaches the photosensitive layer" means that the light reaches the photosensitive layer in such a larger light amount that an image is formed in the development step.

When the first light 106a emitted from the first light source 110a to the first photosensitive layer 104a reaches the second photosensitive layer 104b and the second light 106b emitted from the second light source 110b to the second photosensitive layer 104b reaches the first photosensitive layer 104a, the following problem is caused.

Figure 4:
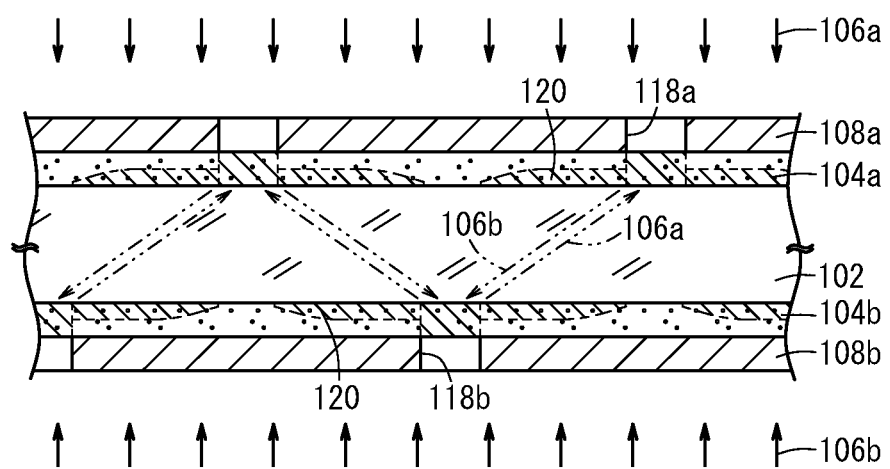
FIG. 4 is an explanatory view showing effects of the lights in a case where the light incident on the first photosensitive layer reaches the second photosensitive layer and the light incident on the second photosensitive layer reaches the first photosensitive layer.
Figure 5:
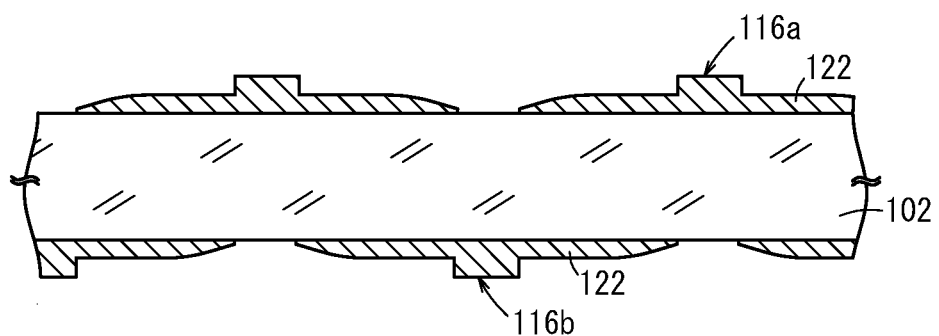
FIG. 5 is an explanatory view showing deteriorated conductive patterns in the case where the light incident on the first photosensitive layer reaches the second photosensitive layer and the light incident on the second photosensitive layer reaches the first photosensitive layer.

Thus, as shown in FIG. 4, the first light 106a from the first light source 110a reaches the first photosensitive layer 104a and is scattered by silver halide particles in the first photosensitive layer 104a, and part of the scattered light is transmitted through the transparent support 102 and reaches the second photosensitive layer 104b. Then, large areas at the boundary between the second photosensitive layer 104b and the transparent support 102 are exposed thereby to form latent images 120. As a result, the second photosensitive layer 104b is exposed not only to the second light 106b from the second light source 110b but also to the first light 106a from the first light source 110a. As shown in FIG. 5, when the second photosensitive layer 104b is developed to produce the conductive sheet 114, the second conductive layer 116b corresponding to the second exposure pattern 118b is formed, and additionally thin conductive layers 122 are formed due to the first light 106a from the first light source 110a in the second conductive layer 116b, so that the desired pattern (corresponding to the second exposure pattern 118b) cannot be obtained.

This is true also for the first photosensitive layer 104a. As shown in FIG. 4, the second light 106b from the second light source 110b reaches the second photosensitive layer 104b and is scattered by silver halide particles in the second photosensitive layer 104b, and part of the scattered light is transmitted through the transparent support 102 and reaches the first photosensitive layer 104a. Then, large areas at the boundary between the first photosensitive layer 104a and the transparent support 102 are exposed thereby to form latent images 120. As a result, the first photosensitive layer 104a is exposed not only to the first light 106a from the first light source 110a but also to the second light 106b from the second light source 110b. As shown in FIG. 5, when the first photosensitive layer 104a is developed, the first conductive layer 116a corresponding to the first exposure pattern 118a is formed, and additionally thin conductive layers 122 are formed due to the second light 106b from the second light source 110b in the first conductive layer 116a, so that the desired pattern (corresponding to the first exposure pattern 118a) cannot be obtained.

For example, when such a conductive sheet is used in a touch panel on a liquid crystal display panel, the image on the display screen may be blocked by the thin conductive layers 122, whereby the touch panel may become unuseful.

Therefore, in this embodiment, the exposure is controlled such that the first light 106a emitted from the first light source 110a to the first photosensitive layer 104a does not substantially reach the second photosensitive layer 104b and the second light 106b emitted from the second light source 110b to the second photosensitive layer 104b does not substantially reach the first photosensitive layer 104a.

Several methods for controlling the exposure, such that the first light 106a incident on the first photosensitive layer 104a does not substantially reach the second photosensitive layer 104b and the second light 106b incident on the second photosensitive layer 104b does not substantially reach the first photosensitive layer 104a, will be described below.

For example, the image formation on the first photosensitive layer 104a may be controlled at least by selecting the sensitivity of the second photosensitive layer 104b, and the image formation on the second photosensitive layer 104b may be controlled at least by selecting the sensitivity of the first photosensitive layer 104a.

In this case, for example, a material having a light absorption sensitivity within the wavelength range of the first light 106a may be used in the first photosensitive layer 104a, and a material having a light absorption sensitivity within the wavelength range of the second light 106b may be used in the second photosensitive layer 104b.

Figure 6A:
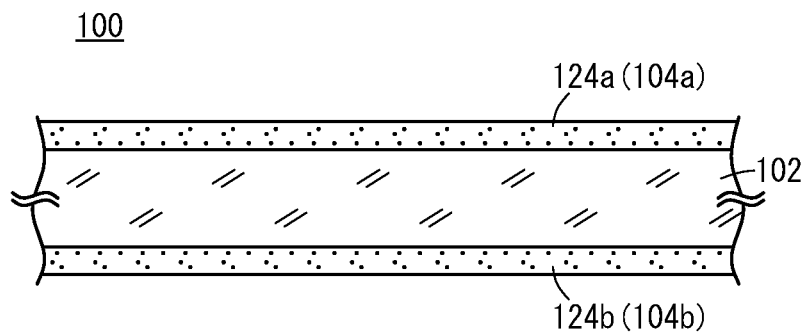
FIG. 6A is a cross-sectional view partially showing a photosensitive material having the first photosensitive layer containing a first photosensitive silver halide emulsion layer and the second photosensitive layer containing a second photosensitive silver halide emulsion layer.

In particular, as shown in FIG. 6A, when the first photosensitive layer 104a contains a first photosensitive silver halide emulsion layer 124a, and the second photosensitive layer 104b contains a second photosensitive silver halide emulsion layer 124b, the following manners (1-a) to (1-c) may be used.

(1-a) The second light 106b irradiation energy absorption amount of the first photosensitive layer 104a, which affects the image formation thereon, is controlled at least by selecting the applied silver amount of the second photosensitive silver halide emulsion layer 124b, and the first light 106a irradiation energy absorption amount of the second photosensitive layer 104b, which affects the image formation thereon, is controlled at least by selecting the applied silver amount of the first photosensitive silver halide emulsion layer 124a.

(1-b) The second light 106b irradiation energy absorption amount of the first photosensitive layer 104a is controlled at least by selecting the light absorbance of a coloring matter contained in the second photosensitive silver halide emulsion layer 124b, and the first light 106a irradiation energy absorption amount of the second photosensitive layer 104b is controlled at least by selecting the light absorbance of a coloring matter contained in the first photosensitive silver halide emulsion layer 124a.

(1-c) The second light 106b irradiation energy absorption amount of the first photosensitive layer 104a is controlled at least by selecting the applied silver amount of the second photosensitive silver halide emulsion layer 124b and the light absorbance of the coloring matter contained in the second photosensitive silver halide emulsion layer 124b, and the first light 106a irradiation energy absorption amount of the second photosensitive layer 104b is controlled at least by selecting the applied silver amount of the first photosensitive silver halide emulsion layer 124a and the light absorbance of the coloring matter contained in the first photosensitive silver halide emulsion layer 124a.

Figure 6B:
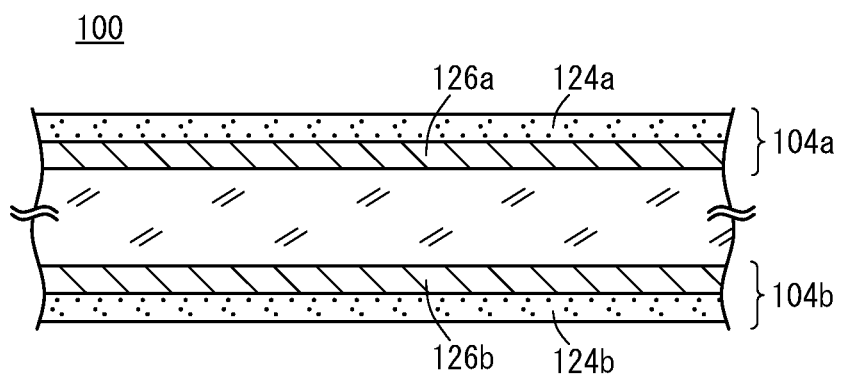
FIG. 6B is a cross-sectional view partially showing a photosensitive material having the first photosensitive layer containing the first photosensitive silver halide emulsion layer and a first antihalation layer and the second photosensitive layer containing the second photosensitive silver halide emulsion layer and a second antihalation layer.

Furthermore, as shown in FIG. 6B, when the first photosensitive layer 104a contains the first photosensitive silver halide emulsion layer 124a and a first antihalation layer 126a formed between the first photosensitive silver halide emulsion layer 124a and the transparent support 102, and the second photosensitive layer 104b contains the second photosensitive silver halide emulsion layer 124b and a second antihalation layer 126b formed between the second photosensitive silver halide emulsion layer 124b and the transparent support 102, the following manners (2-a) and (2-b) may be used.

(2-a) The second light 106b irradiation energy absorption amount of the first photosensitive layer 104a, which affects the image formation thereon, is controlled at least by selecting the light absorbances of coloring matters contained in the first antihalation layer 126a and the second antihalation layer 126b, and the first light 106a irradiation energy absorption amount of the second photosensitive layer 104b, which affects the image formation thereon, is controlled at least by selecting the light absorbances of coloring matters contained in the first antihalation layer 126a and the second antihalation layer 126b.

(2-b) The second light 106b irradiation energy absorption amount of the first photosensitive layer 104a is controlled at least by selecting the applied silver amount of the second photosensitive silver halide emulsion layer 124b and the light absorbances of the coloring matters contained in the first antihalation layer 126a and the second antihalation layer 126b, and the first light 106a irradiation energy absorption amount of the second photosensitive layer 104b is controlled at least by selecting the applied silver amount of the first photosensitive silver halide emulsion layer 124a and the light absorbances of the coloring matters contained in the first antihalation layer 126a and the second antihalation layer 126b.

In a case where the first antihalation layer 126a and the second antihalation layer 126b are not formed (see the above manners (1-a) to (1-c)), the applied silver amount (in the silver density) of each of the first photosensitive silver halide emulsion layer 124a and the second photosensitive silver halide emulsion layer 124b is preferably 5 to 30 g/m$^2$, more preferably 7 to 20 g/m$^2$, further preferably 10 to 20 g/m$^2$.

In a case where the first antihalation layer 126a and the second antihalation layer 126b are formed (see the above manners (2-a) and (2-b)), the applied silver amount (in the silver density) of each of the first photosensitive silver halide emulsion layer 124a and the second photosensitive silver halide emulsion layer 124b is preferably 3 to 30 g/m$^2$, more preferably 3 to 20 g/m$^2$, further preferably 3 to 15 g/m$^2$, particularly preferably 3 to 9 g/m$^2$. In this case, when the applied silver amount (in the silver density) is less than 15 g/m$^2$, the amount of the coloring matter (or a light-absorbing dye) applied to each of the first antihalation layer 126a and the second antihalation layer 126b (the applied coloring matter amount of each of the first antihalation layer 126a and the second antihalation layer 126b) is preferably 50 to 250 mg/m$^2$, more preferably 70 to 200 mg/m$^2$.

In the above manners (1-b), (1-c), (2-a), and (2-b), the light absorbance of the coloring matter is preferably 0.1 to 1.5 (no unit), more preferably 0.2 to 1.0 (no unit). The coloring matter (or the light-absorbing dye) is removed in the subsequent development treatment. The exposure amount per unit time may be controlled by selecting the density of a neutral density filter (an ND filter) disposed in each of the first light source 110a and the second light source 110b to achieve an appropriate exposure condition.

Figure 7:
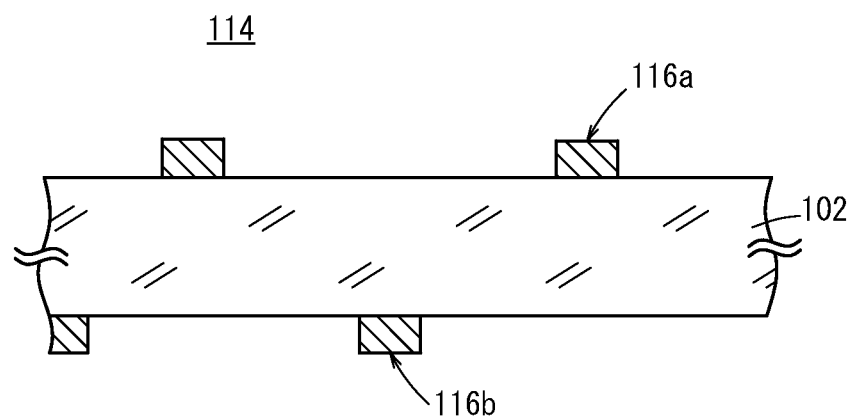
FIG. 7 is a cross-sectional view partially showing a conductive sheet produced by the method for producing a conductive sheet according to the embodiment of the present invention.

When the exposure is controlled in this manner, as shown in FIG. 3, the first light 106a emitted from the first light source 110a to the first photosensitive layer 104a does not reach the second photosensitive layer 104b, and similarly the second light 106b emitted from the second light source 110b to the second photosensitive layer 104b does not reach the first photosensitive layer 104a. Consequently, as shown in FIG. 7, in the subsequent development treatment, only the first conductive layer 116a corresponding to the first exposure pattern 118a is formed on the one main surface of the transparent support 102, and only the second conductive layer 116b corresponding to the second exposure pattern 118b is formed on the other main surface of the transparent support 102, so that the conductive sheet 114 can be obtained with desired patterns.

Thus, in the present invention, the same or different patterns can be formed on each side (each of front and back sides) of one transparent support 102 with excellent position accuracy by the exposure step. Therefore, an electrode for a touch panel or the like can be easily formed, and the touch panel or the like can be made thinner (smaller).

A touch panel production method according to the present embodiment, which uses the conductive sheet production method of the embodiment, will be described below with reference to FIGS. 8 to 18. First the structure of a touch panel produced by the touch panel production method of the present embodiment will be described below with reference to FIGS. 8 to 14.

Figure 8:
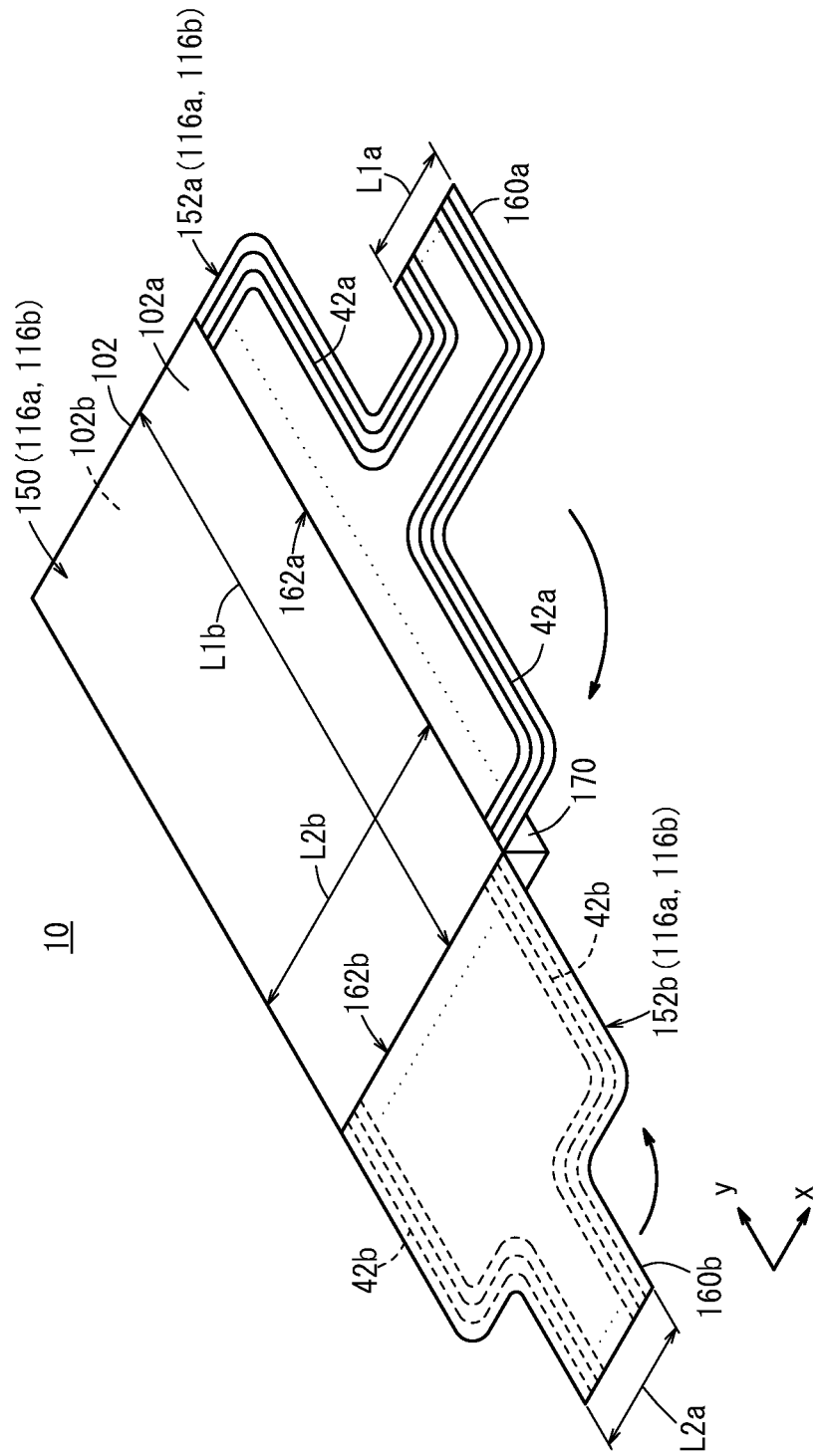
FIG. 8 is a perspective view showing a conductive sheet used for a touch panel.
Figure 9:
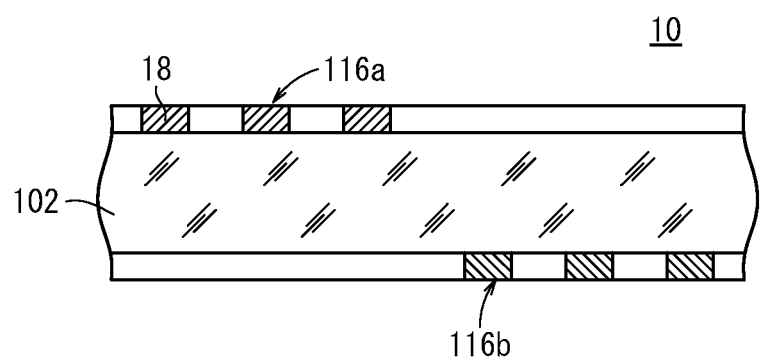
FIG. 9 is a cross-sectional view partially showing the conductive sheet of FIG. 8.

The structure of a conductive sheet 10 used in the touch panel will be described below. As shown in FIGS. 8 and 9, in the conductive sheet 10, a sensing region 150, a first terminal wiring region 152a, and a second terminal wiring region 152b each containing the first conductive layer 116a and the second conductive layer 116b are formed on one transparent support 102 by the one-shot exposure and development. The sensing region 150 has very fine conductive patterns, and the patterns are not illustrated in FIG. 8 but are shown in FIGS. 10 to 14. Furthermore, the illustration of the conductive patterns of the first terminal wiring region 152a and the second terminal wiring region 152b is partially omitted in FIG. 8.

Figure 10:
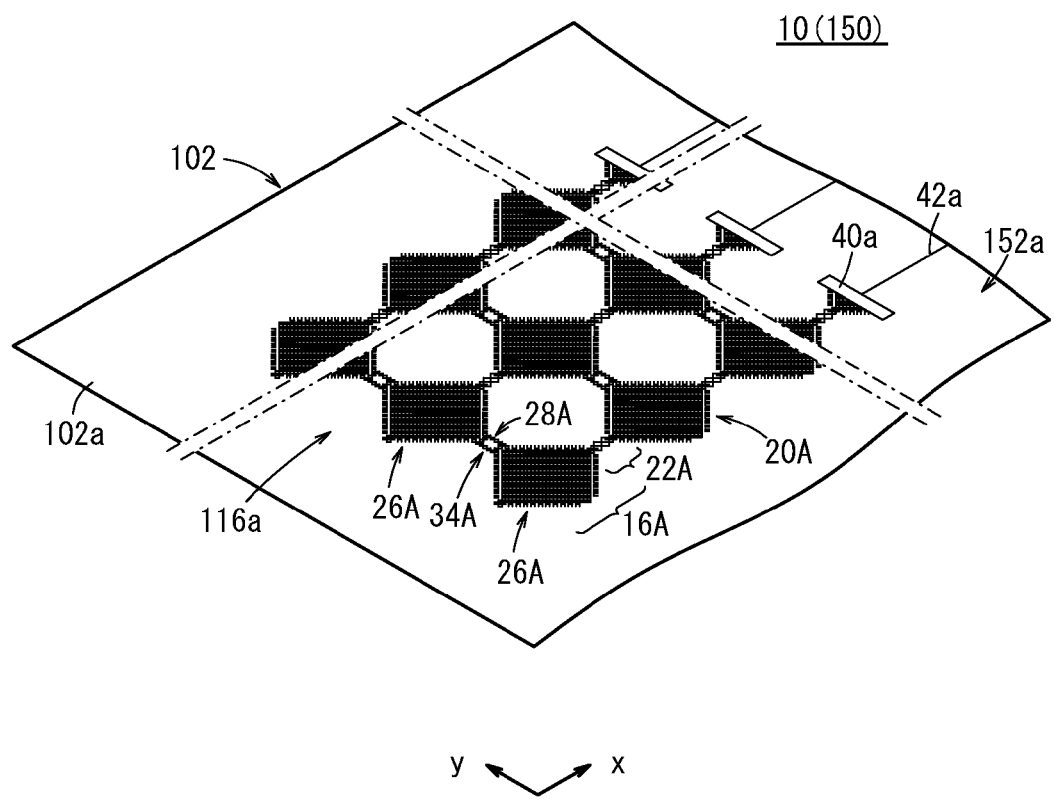
FIG. 10 is a perspective view partially showing an example of conductive patterns formed on one main surface of a transparent support in a sensing region of the conductive sheet of FIG. 8.

The sensing region 150 will be described below with reference to FIGS. 10 to 14. As shown in FIG. 10, in the sensing region 150, two or more first conductive large lattices 16A are formed on one main surface 102a (e.g. an upper surface) of the transparent support 102. The first large lattices 16A each contain a combination of two or more small lattices 18 (see FIG. 11). A first dummy pattern 20A (a first unconnected pattern), which is not connected to the first large lattices 16A, is formed near each side of the first large lattices 16A. First connections 22A are formed between the first large lattices 16A, and each adjacent two of the first large lattices 16A are electrically connected by the first connection 22A. The first connections 22A each contain one or more medium lattices 24 (24a to 24d), and the pitch of the medium lattices 24 is n times larger than that of the small lattices 18 (in which n is a real number larger than 1). The small lattices 18 have a smallest square shape.

The side length of the first large lattice 16A is preferably 3 to 10 mm, more preferably 4 to 6 mm. When the side length is less than the lower limit, for example in the case of using the conductive sheet 10 in a touch panel, the first large lattices 16A exhibit a lowered electrostatic capacitance in the detection process, and the touch panel is likely to cause a detection trouble. On the other hand, when the side length is more than the upper limit, the position detection accuracy may be deteriorated. The side length of each small lattice 18 in the first large lattices 16A is preferably 50 to 500 μm, more preferably 150 to 300 μm, for the same reasons. When the side length of the small lattice 18 is within this range, the conductive sheet 10 has high transparency and thereby can be suitably used at the front of a display device with excellent visibility.

The two or more first large lattices 16A are arranged in an x direction (a first direction) with the first connection 22A disposed therebetween, to form one first conductive pattern 26A. Two or more of the first conductive patterns 26A are arranged in a y direction (a second direction) perpendicular to the x direction. Electrically isolated first insulations 28A are disposed between the adjacent first conductive patterns 26A.

Figure 12:
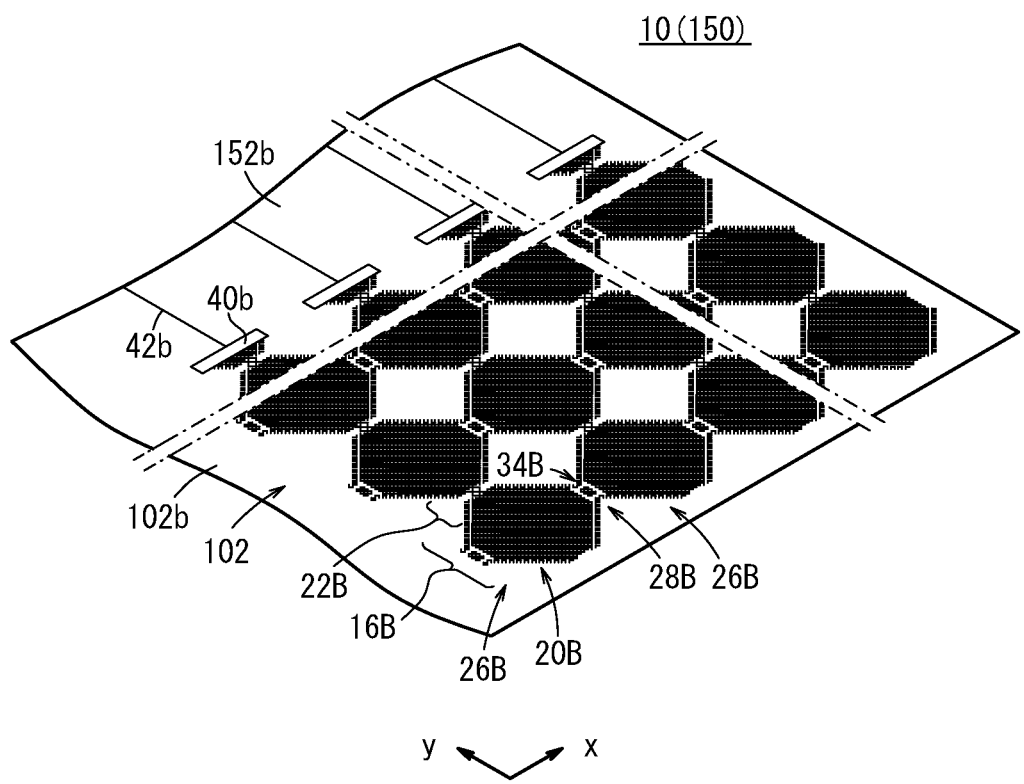
FIG. 12 is a perspective view partially showing an example of conductive patterns formed on the other main surface of the transparent support in the sensing region of the conductive sheet of FIG. 8.

Meanwhile, as shown in FIG. 12, two or more second conductive large lattices 16B are formed on the other main surface 102b (the back surface) of the transparent support 102. The second large lattices 16B each contain a combination of two or more small lattices 18 (see FIG. 13). A second dummy pattern 20B (a second unconnected pattern), which is not connected to the second large lattices 16B, is formed near each side of the second large lattices 16B. Second connections 22B are formed between the second large lattices 16B, and each adjacent two of the second large lattices 16B are electrically connected by the second connection 22B. The second connections 22B each contain one or more medium lattices 24 (24e to 24h), and the pitch of the medium lattices 24 is n times larger than that of the small lattices 18 (in which n is a real number larger than 1). The side length of the second large lattice 16B is preferably 3 to 10 mm, more preferably 4 to 6 mm, as well as the first large lattice 16A.

The two or more second large lattices 16B are arranged in the y direction (the second direction) with the second connection 22B disposed therebetween, to form one second conductive pattern 26B. Two or more of the second conductive patterns 26B are arranged in the x direction (the first direction). Electrically isolated second insulations 28B are disposed between the adjacent second conductive patterns 26B.

A specific example of the conductive patterns of the first conductive layer 116a formed on the one main surface 102a of the transparent support 102 and the second conductive layer 116b formed on the other main surface 102b of the transparent support 102 in the sensing region 150 will be described below.

Figure 11:
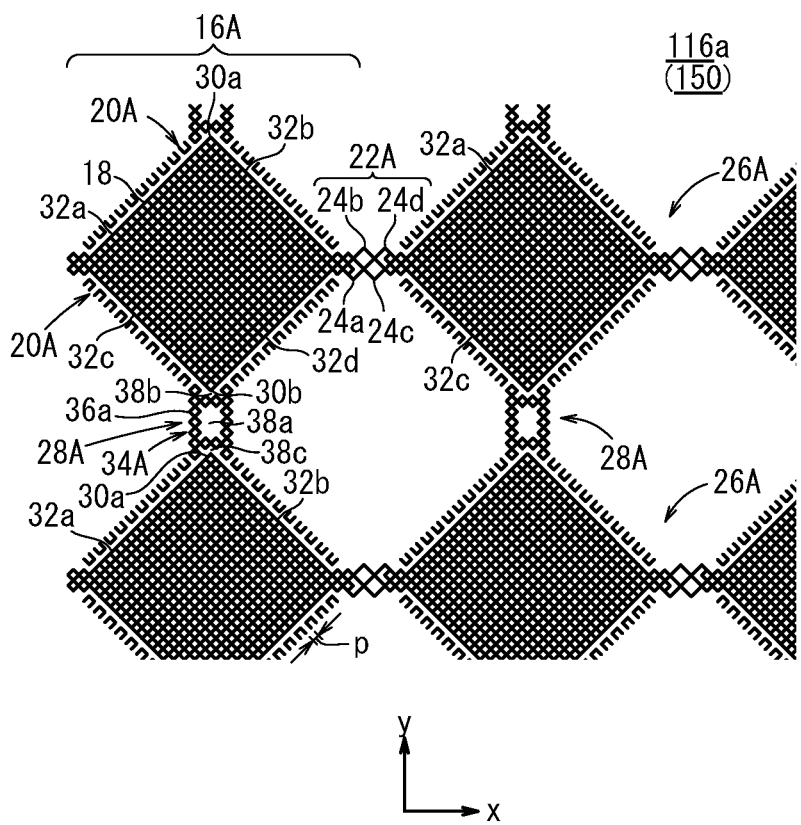
FIG. 11 is a plan view partially showing the conductive patterns of FIG. 10.

As shown in FIG. 11, in the pattern on the one main surface 102a of the transparent support 102 in the sensing region 150, the four sides of the first large lattice 16A each have a straight line shape. Of the four sides, a first side 32a and a second side 32b are on one corner 30a unconnected to the adjacent first large lattice 16A, and a third side 32c and a fourth side 32d are on the other corner 30b unconnected to the adjacent first large lattice 16A. In other words, the intersection of the straight lines of the first side 32a and the second side 32b forms the one corner 30a of the first large lattice 16A, and the intersection of the straight lines of the third side 32c and the fourth side 32d forms the other corner 30b of the first large lattice 16A.

In the first connection 22A, the four medium lattices 24 (the first medium lattice 24a to the fourth medium lattice 24d) are arranged in a zigzag manner, and each of the medium lattices 24 has a size equal to the total size of four small lattices 18. The first medium lattice 24a is disposed at the intersection of the second side 32b and the fourth side 32d, and forms an L-shaped space in combination with one small lattice 18. The second medium lattice 24b is disposed on one side of the first medium lattice 24a, and forms such a square space that four small lattices 18 are arranged in a matrix and the central cross is removed. The third medium lattice 24c is adjacent to one vertex of the first medium lattice 24a and one side of the second medium lattice 24b, and has the same shape as the second medium lattice 24b. The fourth medium lattice 24d is disposed at the intersection of the third side 32c and the first side 32a, is adjacent to one vertex of the second medium lattice 24b and one side of the third medium lattice 24c, and forms an L-shaped space in combination with one small lattice 18 similarly to the first medium lattice 24a. When the small lattices 18 have an arrangement pitch of P, the medium lattices 24 have an arrangement pitch of 2P.

The above described first dummy pattern 20A is formed near each of the four sides (the first side 32a to the fourth side 32d) of the first large lattice 16A. The first dummy pattern 20A is formed such that two or more parts each having a shape corresponding to the partially-removed small lattice 18 are arranged along the corresponding straight side. In the example of FIG. 11, the part has a shape obtained by removing one side from the small lattice 18 and thus the shape has two corners and one opening (referred to simply as an approximately U-shape), and ten of the parts are arranged such that the openings are opened in the direction away from the corresponding side of the first large lattice 16A. The arrangement pitch of the parts is twice as large as the arrangement pitch P of the small lattices 18 in the first large lattices 16A. For example, the shortest distance between the straight line shape of the first side 32a and the approximately U-shape of the first dummy pattern 20A is approximately equal to the side length of the inner periphery of the small lattice 18. This is true also for the second side 32b to the fourth side 32d.

In the first insulation 28A, a first insulation pattern 34A unconnected to the first large lattices 16A is formed. The first insulation pattern 34A has a first assembly pattern portion 36a containing two or more small lattices 18 arranged and three spaces 38 (38a to 38c) containing no small lattices 18.

Specifically, the first assembly pattern portion 36a contains a combination of four straight lines composed of a plurality of the small lattices 18 (two long straight lines and two short straight lines). Each of the straight lines is formed by arranging a plurality of the small lattices 18 so as to connect the vertices of the small lattices 18. With respect to the adjacent two first large lattices 16A with the first insulation 28A interposed therebetween, the three spaces 38 include a first space 38a containing no small lattices 18 and which is surrounded by the first assembly pattern portion 36a, a second space 38b containing no small lattices 18 and which is formed near the other corner 30b of one first large lattice 16A, and a third space 38c containing no small lattices 18 and which is formed near the one corner 30a of the other first large lattice 16A.

For example, of the four straight lines, each of the two long straight lines is formed by arranging seven small lattices 18 so as to connect the vertices thereof. The small lattice 18 in one end of one long straight line is positioned adjacent to the first dummy pattern 20A arranged along the third side 32c of the one first large lattice 16A at the same pitch near the other corner 30b of the one first large lattice 16A, and the small lattice 18 in the other end of the one long straight line is positioned adjacent to the first dummy pattern 20A arranged along the first side 32a of the other first large lattice 16A at the same pitch near the one corner 30a of the other first large lattice 16A. Similarly, the small lattice 18 in one end of the other long straight line is positioned adjacent to the first dummy pattern 20A arranged along the fourth side 32d of the one first large lattice 16A at the same pitch near the other corner 30b of the one first large lattice 16A, and the small lattice 18 in the other end of the other long straight line is positioned adjacent to the first dummy pattern 20A arranged along the second side 32b of the other first large lattice 16A at the same pitch near the one corner 30a of the other first large lattice 16A.

Of the two short straight lines, one short straight line contains two small lattices 18 connecting the 2nd small lattice 18 in the one long straight line from the one end and the 2nd small lattice 18 in the other long straight line from the one end. Similarly, the other short straight line contains two small lattices 18 connecting the 2nd small lattice 18 in the one long straight line from the other end and the 2nd small lattice 18 in the other long straight line from the other end.

When the small lattices 18 have an arrangement pitch of P, the first insulation 28A has a width of mP (in which m is an integer of 1 or more). The width of the first insulation 28A is defined as the shortest distance between the adjacent first conductive patterns 26A (i.e. the distance between the other corner 30b of the one first large lattice 16A and the one corner 30a of the other first large lattice 16A). Thus, the first insulation pattern 34A has a maximum length of mP or less in the width direction of the first insulation 28A. The maximum length is the distance between a part in the one short straight line facing the other corner 30b of the one first large lattice 16A and a part in the other short straight line facing the one corner 30a of the other first large lattice 16A.

As shown in FIG. 10, in the above-constructed conductive pattern, in one end of each first conductive pattern 26A, the first connection 22A is not formed on the open end of the first large lattice 16A. In the other end of the first conductive pattern 26A, the end of the first large lattice 16A is electrically connected to a corresponding first terminal wiring pattern 42a by a first wire connection 40a in the first terminal wiring region 152a.

Figure 13:
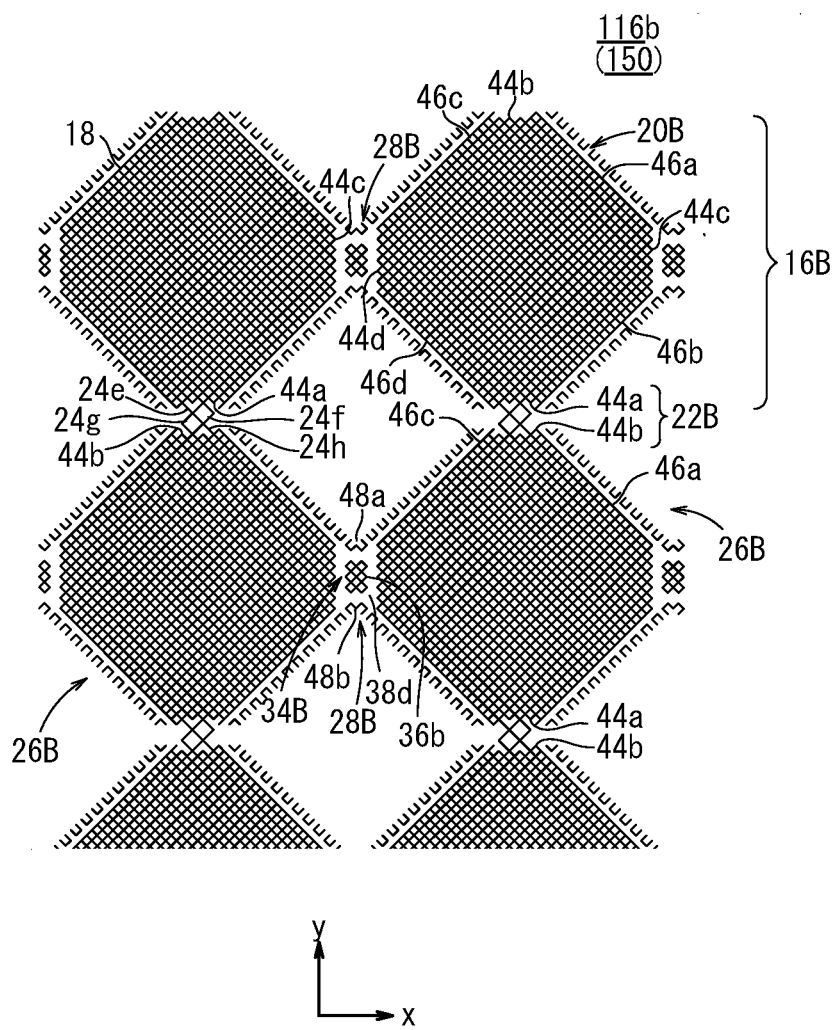
FIG. 13 is a plan view partially showing the conductive patterns of FIG. 12.

As shown in FIG. 13, in the pattern on the other main surface 102b of the transparent support 102 in the sensing region 150, the second large lattice 16B has an approximately octagonal shape unlike the first large lattice 16A. The second large lattice 16B has four short sides 44 (a first short side 44a to a fourth short side 44d) and four long sides 46 (a first long side 46a to a fourth long side 46d). Between the second large lattices 16B which are adjacent to each other in the y direction, the second connection 22B is formed between the first short side 44a of one second large lattice 16B and the second short side 44b of the other second large lattice 16B. Between the second large lattices 16B which are adjacent to each other in the x direction, the second insulation 28B is formed between the third short side 44c of one second large lattice 16B and the fourth short side 44d of the other second large lattice 16B.

The four long sides 46 of the second large lattice 16B each have a straight line shape. Of the four long sides, the first long side 46a and the second long side 46b are adjacent to the third short side 44c facing one second insulation 28B, and the third long side 46c and the fourth long side 46d are adjacent to the fourth short side 44d facing another second insulation 28B.

In the second connection 22B, the four medium lattices 24 (the fifth medium lattice 24e to the eighth medium lattice 24h) are arranged in a zigzag manner, and each of the medium lattices 24 has a size equal to the total size of four small lattices 18. The fifth medium lattice 24e is disposed on the first short side 44a, and forms an L-shaped space in combination with one small lattice 18. The sixth medium lattice 24f is disposed on one side of the fifth medium lattice 24e, and forms such a square space that four small lattices 18 are arranged in a matrix and the central cross is removed. The seventh medium lattice 24g is adjacent to one vertex of the fifth medium lattice 24e and one side of the sixth medium lattice 24f, and has the same shape as the sixth medium lattice 24f. The eighth medium lattice 24h is disposed on the second short side 44b, is adjacent to one vertex of the sixth medium lattice 24f and one side of the seventh medium lattice 24g, and forms an L-shaped space in combination with one small lattice 18 similarly to the fifth medium lattice 24e. When the small lattices 18 have an arrangement pitch of P, the medium lattices 24 have an arrangement pitch of 2P.

The above described second dummy pattern 20B is formed near each of the four long side 46 (the first long side 46a to the fourth long side 46d) of the second large lattice 16B. The second dummy pattern 20B is formed such that two or more parts each having a shape corresponding to the partially-removed small lattice 18 are arranged along the corresponding straight side. In the example of FIG. 13, the part has a shape formed by removing one side from the small lattice 18 and thus the shape has an approximately U-shape, and ten of the parts are arranged such that the openings are opened in the direction away from the corresponding long side of the second large lattice 16B. The arrangement pitch of the parts is twice as large as the arrangement pitch P of the small lattices 18 in the second large lattices 16B. For example, the shortest distance between the straight line shape of the first long side 46a and the approximately U-shape of the second dummy pattern 20B is approximately equal to the side length of the inner periphery of the small lattice 18. This is true also for the second long side 46b to the fourth long side 46d.

In the second insulation 28B, a second insulation pattern 34B unconnected to the second large lattices 16B is formed. The second insulation pattern 34B has a second assembly pattern portion 36b containing two or more small lattices 18 arranged, a first bend pattern portion 48a and a second bend pattern portion 48b each containing two approximately U-shapes, and a fourth space 38d containing no small lattices 18.

Specifically, the second assembly pattern portion 36b is formed by arranging a plurality of the small lattices 18 in a matrix so as to connect the vertices of the small lattices 18. The number (e.g., six) of the small lattices 18 is such that they can be accommodated in the first space 38a of the first insulation pattern 34A in the first conductive pattern 26A shown in FIG. 11.

The first bend pattern portion 48a has the two approximately U-shapes formed on one end of the second insulation pattern 34B (between the intersection of the fourth short side 44d and the third long side 46c in one second large lattice 16B and the intersection of the third short side 44c and the first long side 46a in another second large lattice 16B). The ends of the two approximately U-shapes are connected, an angle formed by the sides at the ends being approximately 90°.

Similarly, the second bend pattern portion 48b has the two approximately U-shapes formed on the other end of the second insulation pattern 34B (between the intersection of the fourth short side 44d and the fourth long side 46d in the one second large lattice 16B and the intersection of the third short side 44c and the second long side 46b in the other second large lattice 16B). The ends of the two approximately U-shapes are connected, an angle formed by the sides at the ends being approximately 90°.

The fourth space 38d comprises an empty space containing no small lattices 18 and has a shape in which the four straight lines of the first assembly pattern portion 36a in the first insulation pattern 34A shown in FIG. 11 can be accommodated.

When the small lattices 18 have an arrangement pitch of P, the second insulation 28B has a width of nP (in which n is an integer of 1 or more). The width of the second insulation 28B is defined as the shortest distance between the adjacent second conductive patterns 26B (i.e. the distance between the fourth short side 44d of the one second large lattice 16B and the third short side 44c of the other second large lattice 16B). Thus, the second insulation pattern 34B has a maximum length of nP or less, preferably less than nP, in the width direction of the second insulation 28B. The maximum length is the distance between a part facing the fourth short side 44d of the one second large lattice 16B and a part facing the third short side 44c of the other second large lattice 16B in the second assembly pattern portion 36b.

As shown in FIG. 12, in the above-constructed conductive pattern, in one end of each second conductive pattern 26B, the second connection 22B is not formed on the open end of the second large lattice 16B. In the other end of the second conductive pattern 26B, the end of the second large lattice 16B is electrically connected to a corresponding second terminal wiring pattern 42b by a second wire connection 40b in the second terminal wiring region 152b.

Figure 14:
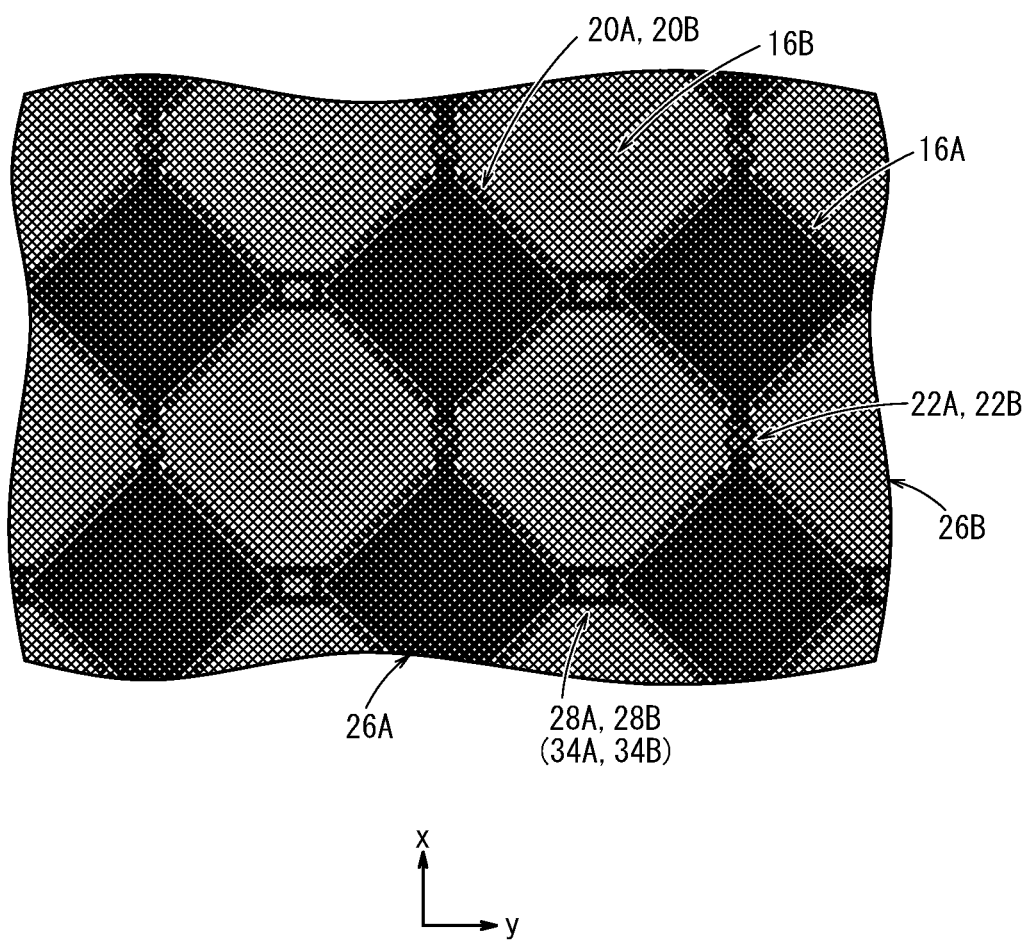
FIG. 14 is a plan view partially showing an example of the sensing region of the conductive sheet of FIG. 8 from above.

As shown in FIG. 14, the positional pattern relation between the first conductive layer 116a formed on the one main surface 102a and the second conductive layer 116b formed on the other main surface 102b of the transparent support 102 in the sensing region 150 is such that the first connections 22A of the first conductive patterns 26A and the second connections 22B of the second conductive patterns 26B are arranged facing each other with the transparent support 102 interposed therebetween, and also the first insulations 28A of the first conductive patterns 26A and the second insulations 28B of the second conductive patterns 26B are arranged facing each other with the transparent support 102 interposed therebetween. Though the first conductive patterns 26A and the second conductive patterns 26B are exaggeratingly shown by thick lines and thin lines respectively in order to clearly represent the positions thereof in FIG. 14, actually they have the same line width.

When the sensing region 150 is observed from above, the spaces between the first large lattices 16A are filled with the second large lattices 16B. Thus, the sensing region 150 is covered with the large lattices. In this case, the first dummy patterns 20A and the second dummy patterns 20B overlap with each other to form combined patterns between the first large lattices 16A and the second large lattices 16B. The combined pattern has a width equal to or larger than the side length of the small lattices 18. The width of the combined pattern is defined as the shortest distance projected on the one main surface 102a of the transparent support 102, for example, between the first side 32a of the first large lattice 16A and the second long side 46b (facing the first side 32a) of the second large lattice 16B. In the example of FIG. 14, the width of the combined pattern is twice as large as the side length of the small lattices 18. This is true also for the relations between the second side 32b to the fourth side 32d of the first large lattice 16A and the second long side 46b to the fourth long side 46d of the second large lattice 16B.

Thus, as viewed from above, the openings of the approximately U-shapes in the first dummy patterns 20A along the first large lattices 16A are connected and closed by the straight long sides of the second large lattices 16B, and the bottoms of the approximately U-shapes in the first dummy patterns 20A are connected by the bottoms of the approximately U-shapes in the second dummy patterns 20B along the second large lattices 16B. Similarly, the openings of the approximately U-shapes in the second dummy patterns 20B along the second large lattices 16B are connected and closed by the straight long sides of the first large lattices 16A, and the bottoms of the approximately U-shapes in the second dummy patterns 20B are connected by the bottoms of the approximately U-shapes in the first dummy patterns 20A along the first large lattices 16A. As a result, as viewed from above, a plurality of the small lattices 18 are arranged, and the boundaries between the first large lattices 16A and the second large lattices 16B can hardly be found.

For example, in the case of not forming the first dummy patterns 20A and the second dummy patterns 20B, blank areas corresponding to the combined pattern width are formed, whereby the edges of the first large lattices 16A and the second large lattices 16B are highly visible, resulting in deterioration of the visibility. This problem might be solved by overlapping each side of the first large lattices 16A with the corresponding long side of the second large lattices 16B to prevent the formation of the blank area. However, when the stack position accuracy is slightly deteriorated, the overlaps of the straight lines have large widths (the straight lines are thickened), whereby the boundaries between the first large lattices 16A and the second large lattices 16B are highly visible, resulting in deterioration of the visibility.

In contrast, in this embodiment, the first dummy patterns 20A and the second dummy patterns 20B are stacked in the above manner, whereby the boundaries between the first large lattices 16A and the second large lattices 16B are made less visible to improve the visibility.

When the overlap of the first connection 22A and the second connection 22B is observed from above, the connection point of the fifth medium lattice 24e and the seventh medium lattice 24g in the second connection 22B is positioned approximately at the center of the second medium lattice 24b in the first connection 22A, and the connection point of the sixth medium lattice 24f and the eighth medium lattice 24h in the second connection 22B is positioned approximately at the center of the third medium lattice 24c in the first connection 22A. Thus, the first medium lattices 24a to the eighth medium lattices 24h form a plurality of the small lattices 18 in combination. Therefore, the small lattices 18 are formed by the combination of the first connections 22A and the second connections 22B in the overlaps thereof. Thus formed small lattices 18 cannot be distinguished from the surrounding small lattices 18 in the first large lattices 16A and the second large lattices 16B, so that the visibility is improved.

When the overlap of the first insulation pattern 34A of the first insulation 28A and the second insulation pattern 34B of the second insulation 28B is observed from above, the first assembly pattern portion 36a of the first insulation pattern 34A faces the fourth space 38d of the second insulation pattern 34B, and the first space 38a of the first insulation pattern 34A faces the second assembly pattern portion 36b of the second insulation pattern 34B. Furthermore, the second space 38b of the first insulation pattern 34A faces the first bend pattern portion 48a of the second insulation pattern 34B, and the third space 38c of the first insulation pattern 34A faces the second bend pattern portion 48b of the second insulation pattern 34B. In this case, as viewed from above, the openings of the first bend pattern portion 48a are connected and closed by the straight line shapes of the third side 32c and the fourth side 32d near the other corner 30b of the first large lattice 16A, and the openings of the second bend pattern portion 48b are connected and closed by the straight line shapes of the first side 32a and the second side 32b near the one corner 30a of the first large lattice 16A. Therefore, the first insulation patterns 34A and the second insulation patterns 34B form a plurality of the small lattices 18 in combination. Thus formed small lattices 18 cannot be distinguished from the surrounding small lattices 18 in the first large lattices 16A and the second large lattices 16B, so that the visibility is improved.

When the conductive sheet 10 is used in a touch panel, a protective layer is formed on the conductive patterns of the sensing region 150, the first terminal wiring region 152a, and the second terminal wiring region 152b. Furthermore, the first terminal wiring patterns 42a extending from the first conductive patterns 26A in the sensing region 150 to the first terminal wiring region 152a and the second terminal wiring patterns 42b extending from the second conductive patterns 26B in the sensing region 150 to the second terminal wiring region 152b are connected to an IC circuit for position calculation or the like by a connector.

When a finger comes into contact with the protective layer, signals are transmitted from the first conductive pattern 26A and the second conductive pattern 26B corresponding to the finger touch position to the IC circuit. The finger touch position is calculated in the IC circuit based on the transmitted signals. Thus, even when two fingers come into contact with the protective layer simultaneously, the finger touch positions can be detected.

Though the small lattice 18 has a square shape in the above conductive sheet 10, it may have another polygonal shape. Each side of the small lattice 18 may have a straight line shape, a curved shape, or an arc shape. When the small lattice 18 has arc-shaped sides, for example, two opposite sides may have an outwardly protruding arc shape, and the other two opposite sides may have an inwardly protruding arc shape. Alternatively, each side may have a wavy shape containing outwardly protruding arcs and inwardly protruding arcs formed continuously. Of course, each side may have a sine curve shape.

Though the arrangement pitch of the medium lattices 24 in the first connections 22A and the second connections 22B is twice larger than the arrangement pitch P of the small lattices 18 in the above conductive sheet 10, it may be appropriately selected depending on the number of the medium lattices 24. The arrangement pitch of the medium lattices 24 may be 1.5, 3 times, etc. larger than the arrangement pitch P of the small lattices 18. When the arrangement pitch of the medium lattices 24 is excessively small or large, it may be difficult to arrange the first large lattices 16A and the second large lattices 16B, resulting in poor appearance. Thus, the arrangement pitch of the medium lattices 24 is preferably 1 to 10 times, more preferably 1 to 5 times, larger than the arrangement pitch P of the small lattices 18.

Also, the sizes of the small lattices 18 (including the side length and the diagonal line length), the number of the small lattices 18 in the first large lattice 16A, and the number of the small lattices 18 in the second large lattice 16B may be appropriately selected depending on the size and the resolution (the line number) of the touch panel adopting the conductive sheet.

The touch panel production method of this embodiment will be described below with reference to FIGS. 2A to 3, 8, 10, 12, and 15 to 18.

Figure 15:
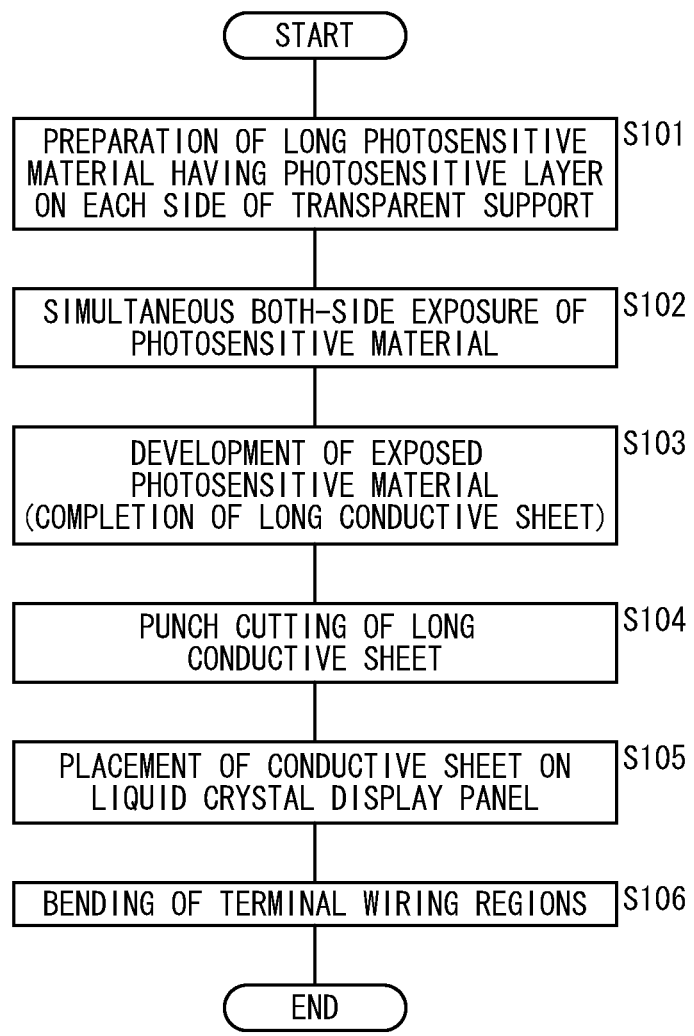
FIG. 15 is a flow chart of a method for producing a touch panel according to the embodiment of the present invention.

First, in the step S101 of FIG. 15, a long photosensitive material 100 is prepared. As shown in FIG. 2A, a photosensitive material 100 has a long transparent support 102, a first photosensitive layer 104a formed on the one main surface of the transparent support 102, and a second photosensitive layer 104b formed on the other main surface of the transparent support 102.

In the step S102, the photosensitive material 100 is exposed. In this exposure step, as shown in FIGS. 2B and 3, a first photomask 108a is placed on the one main surface of the long photosensitive material 100, and a second photomask 108b is placed on the other main surface of the photosensitive material 100. Then, the first exposure treatment for emitting the first light 106a from the first light source 110a to the first photosensitive layer 104a on the transparent support 102 to expose the first photosensitive layer 104a and the second exposure treatment for emitting the second light 106b from the second light source 110b to the second photosensitive layer 104b on the transparent support 102 to expose the second photosensitive layer 104b are simultaneously carried out while the photosensitive material 100 is conveyed in one direction.

In the first and second exposure treatments, areas in the first photosensitive layer 104a that correspond to the first exposure pattern 118a in the first photomask 108a, are exposed, and areas in the second photosensitive layer 104b correspond to the second exposure pattern 118b in the second photomask 108b, are exposed. As described above, the first and second exposure treatments are performed such that the first light 106a from the first light source 110a does not reach the second photosensitive layer 104b and the second light 106b from the second light source 110b does not reach the first photosensitive layer 104a.

In step S103, the exposed photosensitive material 100 is developed thereby to produce the long conductive sheet 114 shown in FIG. 2C. Thus, in the development step, the first conductive layer 116a is formed in a pattern corresponding to the first exposure pattern 118a on the one main surface 102a of the transparent support 102, and the second conductive layer 116b is formed in a pattern corresponding to the second exposure pattern 118b on the other main surface 102b of the transparent support 102.

Figure 16A:
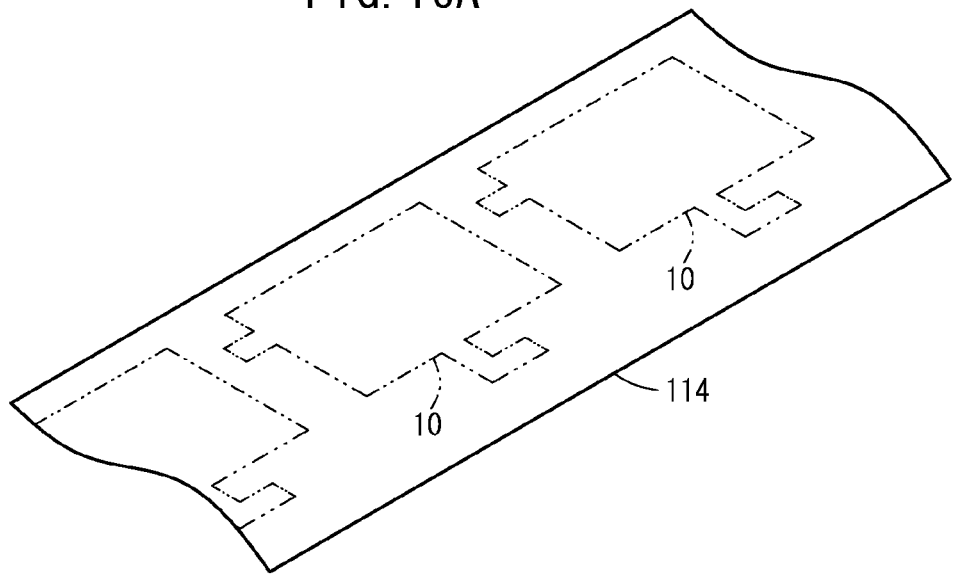
FIG. 16A is an explanatory view partially showing a long conductive sheet produced by subjecting a long photosensitive material to simultaneous both-side exposure and development.

As shown in FIGS. 10 and 16A, a large number of the first conductive patterns 26A and a large number of the first terminal wiring patterns 42a connected thereto collectively form one combination patterning (which is the pattern formed on the one main surface 102a of the transparent support 102, as shown in FIG. 8, and is a first patterning of one touch panel), and a plurality of the first patternings are arranged in the first conductive layer 116a in one direction. As shown in FIGS. 12 and 16A, a large number of the second conductive patterns 26B and a large number of the second terminal wiring patterns 42b connected thereto collectively form one combination patterning (which is the pattern formed on the other main surface 102b of the transparent support 102, as shown in FIG. 8, and is a second patterning of one touch panel), and a plurality of the second patternings are arranged in the second conductive layer 116b in the one direction. In FIG. 16A, the outer shape of the first and second patternings of each touch panel (see FIG. 8) is shown by a dashed-two dotted line. Each portion surrounded by the dashed-two dotted line is made into the conductive sheet 10 of FIG. 8.

Figure 16B:
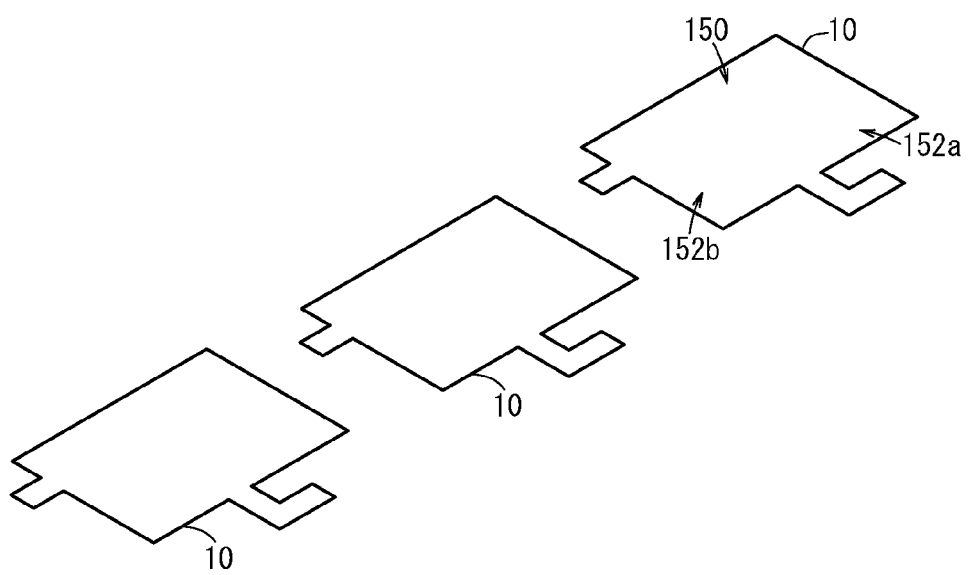
FIG. 16B is an explanatory view partially showing a plurality of conductive sheets formed by punch-cutting the long conductive sheet.

In step S104, as shown in FIG. 16B, the long conductive sheet 114 is subjected to a punch cutting process to obtain a plurality of the conductive sheets 10 each having the sensing region 150, the first terminal wiring region 152a, and the second terminal wiring region 152b. Thus, in the conductive sheet 10, the sensing region 150 contains a large number of the first conductive patterns 26A and a large number of the second conductive patterns 26B complementarily arranged, the first terminal wiring region 152a contains a large number of the first terminal wiring patterns 42a (see FIG. 10), and the second terminal wiring region 152b contains a large number of the second terminal wiring patterns 42b (see FIG. 12).

As shown in FIG. 8, in the first terminal wiring region 152a, the length L1a of a first extension portion 160a (in which a large number of the first terminal wiring patterns 42a extend to the outside) is smaller than the length L1b of a first connection portion 162a (in which a large number of the first terminal wiring patterns 42a are connected to a large number of the first conductive patterns 26A), and the first terminal wiring patterns 42a corresponding to both the left and right first conductive patterns 26A farthest from the center of the arrangement of the first conductive patterns 26A have approximately the same lengths. Similarly, in the second terminal wiring region 152b, the length L2a of a second extension portion 160b (in which a large number of the second terminal wiring patterns 42b extend to the outside) is smaller than the length L2b of a second connection portion 162b (in which a large number of the second terminal wiring patterns 42b are connected to a large number of the second conductive patterns 26B), and the second terminal wiring patterns 42b corresponding to both the left and right second conductive patterns 26B farthest from the center of the arrangement of the second conductive patterns 26B have approximately the same lengths.

In the example of FIG. 8, in the first terminal wiring region 152a, a large number of the first terminal wiring patterns 42a extend from the first connection portion 162a in the first direction (the x direction), and the left and right patterns 42a other than the central pattern 42a are curved toward the center in the second direction (the y direction) to be brought closer to each other (converged) and then curved in the first direction. Furthermore, all the patterns 42a including the central pattern 42a are curved in the second direction and extend to the first extension portion 160a.

On the other hand, in the second terminal wiring region 152b, a large number of the second terminal wiring patterns 42b extend from the second connection portion 162b in the second direction, and the left and right patterns 42b other than the central pattern 42b are curved toward the center in the first direction to be brought closer to each other (converged).

Furthermore, all the patterns 42b including the central pattern 42b extend to the second extension portion 160b.

Figure 17A:
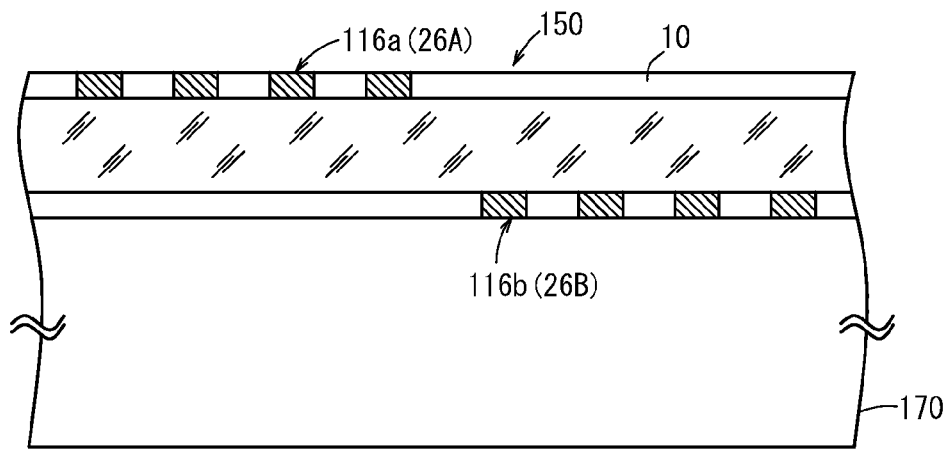
FIG. 17A is an explanatory view showing an example of the conductive sheet placed on a display screen of a liquid crystal display panel.

In step S105, for example, as shown in FIGS. 8 and 17A, the conductive sheet 10 is placed on a liquid crystal display panel 170. In this step, the conductive sheet 10 is disposed such that the sensing region 150 faces a display screen of the liquid crystal display panel 170.

Figure 17B:
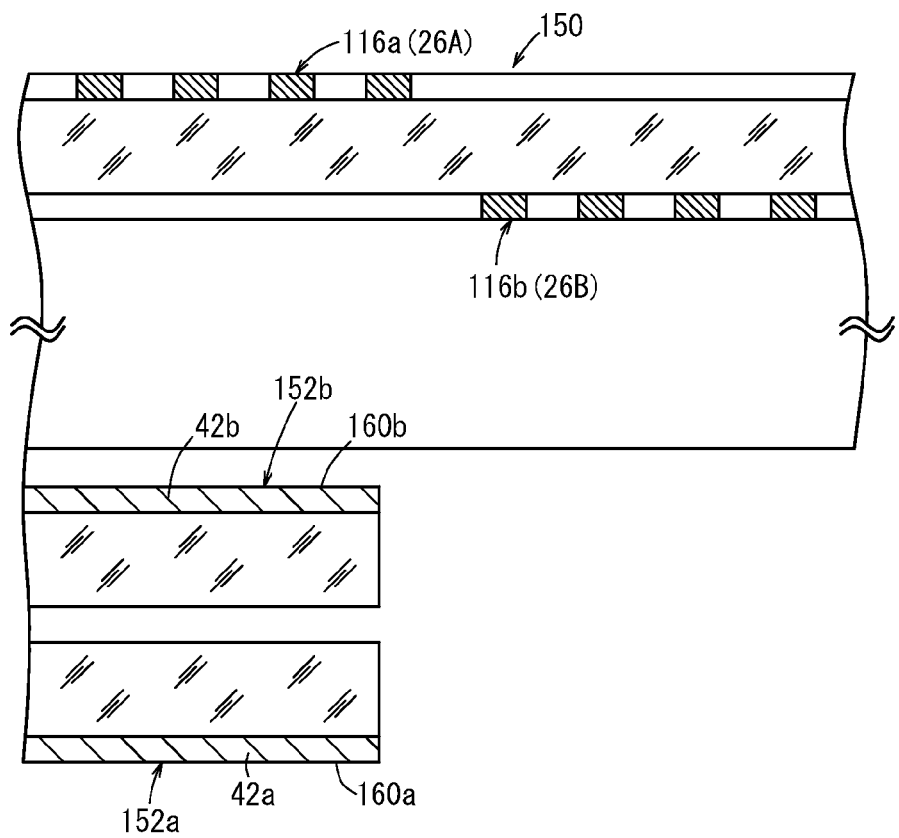
FIG. 17B is an explanatory view partially showing bent first and second terminal wiring regions of the conductive sheet.
Figure 18:
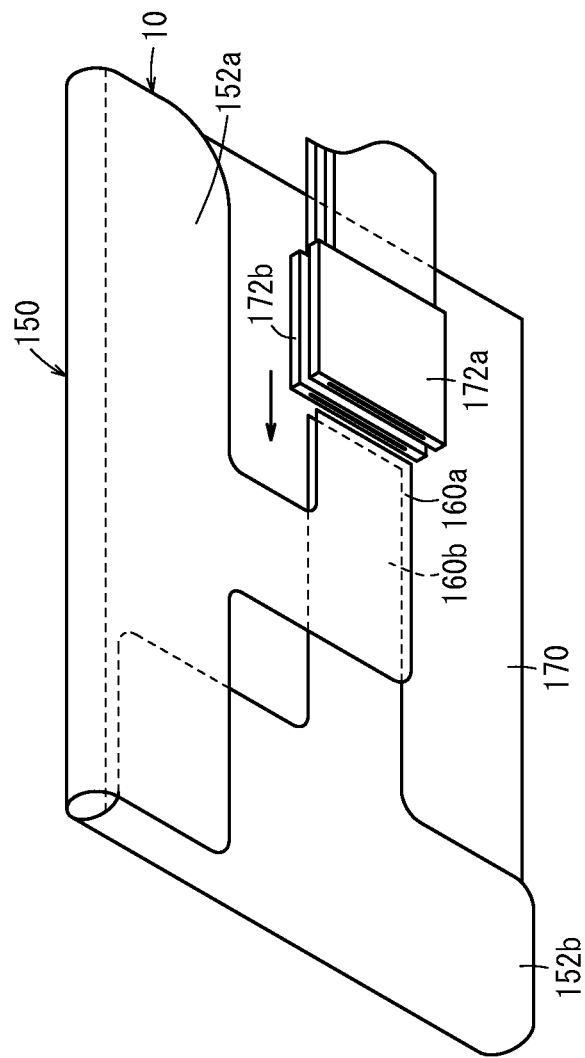
FIG. 18 is a perspective view partially showing the bent first and second terminal wiring regions of the conductive sheet.

In step S106, as shown in FIGS. 17B and 18, the first terminal wiring region 152a and the second terminal wiring region 152b in the conductive sheet 10 are bent toward the back side of the sensing region 150 (i.e. the back side of the liquid crystal display panel 170).

Then, the first extension portion 160a and the second extension portion 160b are inserted into corresponding connectors 172a, 172b respectively, and thereby are electrically connected to an IC circuit for position calculation, etc. At this stage, the production of one touch panel is completed.

Since the touch panel production method of this embodiment utilizes the above described production method of the conductive sheet 114 shown in FIGS. 1 to 7, the exposure time in the step S102 of FIG. 15 can be significantly reduced.

Furthermore, since a large number of the first conductive patterns 26A for the sensing region 150 and a large number of the first terminal wiring patterns 42a for the first terminal wiring region 152a are formed on the one main surface 102a of one transparent support 102, while a large number of the second conductive patterns 26B for the sensing region 150 and a large number of the second terminal wiring patterns 42b for the second terminal wiring region 152b are formed on the other main surface 102b of the transparent support 102, the touch panel can be made thinner (smaller).

When the first terminal wiring patterns 42a have the same line width, the first terminal wiring pattern 42a corresponding to the first conductive pattern 26A farther from the arrangement center exhibits a larger CR time constant. However, since the first terminal wiring patterns 42a corresponding to both the left and right first conductive patterns 26A farthest from the center of the arrangement of the first conductive patterns 26A have approximately the same lengths, as compared with a structure having a shortest pattern at one end and a longest pattern at the other end in the arrangement of conductive patterns as described in Japanese Laid-Open Patent Publication No. 2008-129708, the lengths of the patterns can be smaller in this embodiment. In particular, the lengths of the first conductive patterns 26A farthest from the arrangement center can be reduced to ½ of the length of the longest pattern of the above conventional structure. This is true also for the second conductive patterns 26B. As a result, the CR time constant of the first conductive patterns 26A can be significantly reduced, whereby the response speed can be increased, and the position detection can be readily carried out within an operation time (a scan time). Thus, the screen sizes (not the thickness but the length and width) of the touch panel can be easily increased.

In this embodiment, to further reduce the CR time constant, the first terminal wiring patterns 42a farthest from the center of the arrangement of the first conductive patterns 26A may have the largest line width, and the first terminal wiring pattern 42a closer to the arrangement center may have a smaller line width. In this case, the total CR time constant of the first terminal wiring patterns 42a can be further reduced. Additionally, the number of wires with different line widths is at most ½ of the number of the first terminal wiring patterns 42a, so that the line widths can be easily designed in this case. This is true also for the second terminal wiring patterns 42b.

In addition, since the first terminal wiring region 152a and the second terminal wiring region 152b are bent toward the back side of the sensing region 150, peripheral circuits can be stored compactly, and the size of the device structure containing the liquid crystal display panel 170 can be reduced.

Another preferred conductive sheet production method using a photographic photosensitive silver halide material according to the embodiment will be described below.

The method for producing the conductive sheet of this embodiment includes the following three processes different in the photosensitive materials and development treatments.

(1) A process comprising subjecting a photosensitive black-and-white silver halide material free of physical development nuclei to a chemical or thermal development to form the conductive patterns on the photosensitive material 100.

(2) A process comprising subjecting a photosensitive black-and-white silver halide material having a silver halide emulsion layer containing physical development nuclei to a solution physical development to form the conductive patterns on the photosensitive material 100.

(3) A process comprising subjecting a stack of a photosensitive black-and-white silver halide material free of physical development nuclei and an image-receiving sheet having a non-photosensitive layer containing physical development nuclei to a diffusion transfer development to form the conductive patterns on the non-photosensitive image-receiving sheet.

In the process of (1), an integral black-and-white development procedure is used to form a transmittable conductive film such as a light-transmitting conductive film on the photosensitive material. The resulting silver is a chemically or thermally developed silver containing a high-specific surface area filament, and thereby shows a high activity in the following plating or physical development treatment.

In the process of (2), the silver halide particles are melted around and deposited on the physical development nuclei in the exposed areas to form a transmittable conductive film such as a light-transmitting conductive film on the photosensitive material. Also in this process, an integral black-and-white development procedure is used. Though high activity can be achieved since the silver halide is deposited on the physical development nuclei in the development, the developed silver has a spherical shape with small specific surface.

In the process of (3), the silver halide particles are melted in the unexposed areas, and are diffused and deposited on the development nuclei of the image-receiving sheet, to form a transmittable conductive film such as a light-transmitting conductive film on the image-receiving sheet. In this process, a so-called separate-type procedure is used, the image-receiving sheet being peeled off from the photosensitive material.

A negative or reversal development treatment can be used in the processes. In the diffusion transfer development, the negative development treatment can be carried out using an auto-positive photosensitive material.

The chemical development, thermal development, solution physical development, and diffusion transfer development have the meanings generally known in the art, and are explained in common photographic chemistry texts such as Shin-ichi Kikuchi, "Shashin Kagaku (Photographic Chemistry)", Kyoritsu Shuppan Co., Ltd., 1955 and C. E. K. Mees, "The Theory of Photographic Processes, 4th ed.", Mcmillan, 1977. A liquid treatment is generally used in the present invention, and also a thermal development treatment can be utilized. For example, techniques described in Japanese Laid-Open Patent Publication Nos. 2004-184693, 2004-334077, and 2005-010752 and Japanese Patent Application Nos. 2004-244080 and 2004-085655 can be used in the present invention.

The structure of each layer in the conductive sheet of this embodiment will be described in detail below.

[Transparent Support 102]

The transparent support 102 may be a plastic film, a plastic plate, a glass plate, etc.

Examples of materials for the plastic film and the plastic plate include polyesters such as polyethylene terephthalates (PET) and polyethylene naphthalates (PEN); polyolefins such as polyethylenes (PE), polypropylenes (PP), polystyrenes, and EVA; vinyl resins; polycarbonates (PC); polyamides; polyimides; acrylic resins; and triacetyl celluloses (TAC).

The transparent support 102 is preferably a film or plate of a plastic having a melting point of about 290° C. or lower, such as PET (melting point 258° C.), PEN (melting point 269° C.), PE (melting point 135° C.), PP (melting point 163° C.), polystyrene (melting point 230° C.), polyvinyl chloride (melting point 180° C.), polyvinylidene chloride (melting point 212° C.), or TAC (melting point 290° C.). The PET is particularly preferred from the viewpoints of light transmittance, workability, etc. The conductive sheet 10 for the touch panel is required to be transparent, and therefore the transparent support 102 preferably has a high transparency.

[Photosensitive Silver Halide Emulsion Layer]

The first photosensitive silver halide emulsion layer 124a and the second photosensitive silver halide emulsion layer 124b (hereinafter referred to as the photosensitive silver halide emulsion layers 124) each contain a silver salt and a binder and may further contain a solvent and an additive such as a dye.

The silver salt used in this embodiment may be an inorganic silver salt such as a silver halide or an organic silver salt such as silver acetate. In this embodiment, the silver halide is used because of its excellent light sensing property.

In the case of not forming the antihalation layer, the applied silver amount (the amount of the applied silver salt in the silver density) of the photosensitive silver halide emulsion layer 124 is preferably 7 to 30 g/m$^2$, more preferably 10 to 20 g/m$^2$. In the case of forming the antihalation layer, the applied silver amount is preferably 3 to 30 g/m$^2$, more preferably 3 to 20 g/m$^2$, further preferably 3 to 15 g/m$^2$, particularly preferably 3 to 9 g/m$^2$. When the applied silver amount is within the above range, the exposure of the photosensitive material can be performed such that the first light 106a incident on the first photosensitive layer 104a does not reach the second photosensitive layer 104b and the second light 106b incident on the second photosensitive layer 104b does not reach the first photosensitive layer 104a.

Examples of the binders used in this embodiment include gelatins, polyvinyl alcohols (PVA), polyvinyl pyrolidones (PVP), polysaccharides such as starches, celluloses and derivatives thereof, polyethylene oxides, polyvinylamines, chitosans, polylysines, polyacrylic acids, polyalginic acids, polyhyaluronic acids, and carboxycelluloses. The binders show a neutral, anionic, or cationic property depending on the ionicity of a functional group.

In this embodiment, the amount of the binder in the photosensitive silver halide emulsion layer 124 is not particularly limited, and may be appropriately selected to obtain sufficient dispersion and adhesion properties. The volume ratio of silver/binder in the photosensitive silver halide emulsion layer 124 is preferably 1/4 or more, more preferably 1/2 or more. The silver/binder volume ratio is preferably 100/1 or less, more preferably 50/1 or less. Particularly, the silver/binder volume ratio is further preferably 1/1 to 4/1, most preferably 1/1 to 3/1. When the silver/binder volume ratio of the photosensitive silver halide emulsion layer 124 is within the range, the electric resistance variation can be reduced even under various applied silver amount, whereby the touch panel conductive sheet 10 can be produced with a uniform surface resistance. The silver/binder volume ratio can be obtained by converting the silver halide/binder weight ratio of the material to the silver/binder weight ratio, and by further converting the silver/binder weight ratio to the silver/binder volume ratio.

<Coloring Matter: Light-Absorbing Dye>

A compound represented by the following general formula (A) may be added as the light-absorbing dye (the coloring matter) to the photosensitive silver halide emulsion layer or the antihalation layer.

$$Q1-X-Q2 \qquad \text{General formula (A):}$$

In the formula, Q1 and Q2 each represent a heterocycle, —C(CN)$_2$—, —C(CN)CO—Y, —C(CO—Y)SO$_2$—Y, a substituted benzene ring having a hydroxyl group, an alkoxy group, a sulfonate group, an alkylsulfonate group, an alkoxysulfonate group, —N(alkyl)alkylsulfonate, or —N(alkyl)$_2$, or an unsubstituted benzene ring. Y represents a hydroxyl group, —NHPh, or -Ph, and the Ph group may have a substituent. X represents a divalent linking group of —CO— or —NH—, a trivalent linking group of —C≡, —N≡, or —CH≡, or a combination thereof, and the linking groups may be bonded to form a 5- or 6-membered ring.

Specifically, the dye may be a compound represented by any of the general formulae (D-a) to (D-d) described in Japanese Laid-Open Patent Publication No. 02-294638 (page 11, the 6th line of upper left column to the 4th line from the bottom of lower right column). More specifically, for example, the dye may be any of the compounds D-1 to D23 illustrated in the above publication (pages 12 and 13). In this case, some of the compounds D-1 to D23 can be fixed to the photosensitive silver halide emulsion layer or the antihalation layer using a mordant or as a solid dye dispersion. Alternatively, a solid particle dispersion of a dye represented by the general formula (I) described in claim 1 of Japanese Laid-Open Patent Publication No. 2007-199703 may be used. The dyes represented by the general formula (I) are disclosed in Japanese Laid-Open Patent Publication No. 2007-199703 (0024 to 0071), and a suitable dye also may be selected therefrom.

Thus, a compound represented by the following general formula (I) may be used as the suitable dye.

$$D-(X)_y \qquad \text{General formula (I):}$$

In the general formula (I), D represents a residue of a compound having a chromophore, X represents a dissociable hydrogen atom or a group having a dissociable hydrogen atom, and y represents an integer of 1 to 7. When y is an integer of 2 to 7, a plurality of Xs may be the same or different.

The compound (the dye) represented by the general formula (I) is characterized by having the dissociable hydrogen in the molecular structure. The chromophore compound for the residue D may be selected from various known coloring matters. Examples of such compounds include oxonol dyes, merocyanine dyes, cyanine dyes, arylidene dyes, azomethine dyes, triphenylmethane dyes, azo dyes, anthraquinone dyes, and indoaniline dyes.

X represents the dissociable hydrogen atom or the dissociable hydrogen-containing group, which is bonded to the residue D directly or by a divalent linking group. The divalent linking group between X and D may be an alkylene group, an arylene group, a heterocycle residue, —CO—, —SO$_n$— (n=0, 1, or 2), —NR'— (in which R' represents a hydrogen atom, an alkyl group, or an aryl group), —O—, or a combination thereof. The groups may have a substituent such as an alkyl group, an aryl group, an alkoxy group, an amino group, an acylamino group, a halogen atom, a hydroxyl group, a carboxy group, a sulfamoyl group, a carbamoyl group, or a sulfonamide group. Preferred examples of the divalent linking groups include —(CH$_2$)$_{n'}$— (n'=1, 2, or 3), —CH$_2$CH(CH$_3$)CH$_2$—, 1,2-phenylene, 5-carboxy-1,3-phenylene, 1,4-phenylene, 6-methoxy-1,3-phenylene, and —CONHC$_6$H$_4$—.

When the dye of the general formula (I) is added to the photographic photosensitive silver halide material, the dissociable hydrogen atom or the dissociable hydrogen-containing group represented by X is in the undissociated state and acts to make the dye of the general formula (I) substantially water-insoluble. In the step of developing the photosensitive material, the dissociable hydrogen atom is dissociated thereby to make the dye substantially water-soluble. Examples of the dissociable hydrogen-containing groups represented by X include groups having a carboxylic group, a sulfonamide group, a sulfamoyl group, a sulfonylcarbamoyl group, an acylsulfamoyl group, a phenolic hydroxyl group, etc. The dissociable hydrogen atom represented by X may be contained in an enol group of an oxonol dye, etc.

y is preferably within a range of 1 to 5, particularly preferably within a range of 1 to 3.

The compound represented by the general formula (I) preferably has a dissociable hydrogen-containing group X having a carboxylic group, and particularly preferably has an aryl group substituted with a carboxyl group.

It is further preferred that the compound of the general formula (I) is represented by the following general formula (II) or (III).

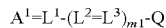

General formula (II):

In the general formula (II), A$^1$ represents an acidic nucleus, Q represents an aryl group or a heterocyclic group, L$^1$, L$^2$, and L$^3$ each represent a methine group, and m1 represents 0, 1, or 2. It should be noted that the compound of the general formula (II) has 1 to 7 water-soluble groups selected from the group consisting of carboxylic groups, sulfonamide groups, sulfamoyl groups, sulfonylcarbamoyl groups, acylsulfamoyl groups, phenolic hydroxyl groups, and enol groups of oxonol dyes.

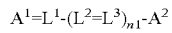

General formula (III):

In the general formula (III), A$^1$ and A$^2$ each represent an acidic nucleus, L$^1$, L$^2$, and L$^3$ each represent a methine group, and n1 represents 0, 1, 2, or 3. It should be noted that the compound of the general formula (III) has 1 to 7 water-soluble groups selected from the group consisting of carboxylic groups, sulfonamide groups, sulfamoyl groups, sulfonylcarbamoyl groups, acylsulfamoyl groups, phenolic hydroxyl groups, and enol groups of oxonol dyes.

The general formulae (II) and (III) will be described in detail below.

The acidic nucleus represented by A1 or A2 is preferably derived from a cyclic ketomethylene compound or a compound having a methylene group sandwiched by electron-withdrawing groups. Examples of the cyclic ketomethylene compounds include 2-pyrazoline-5-one, rhodanine, hydantoin, thiohydantoin, 2,4-oxazolidinedione, isoxazolone, barbituric acid, thiobarbituric acid, indanedione, dioxopyrazolopyridine, hydroxypyridone, pyrazolidinedione, and 2,5-dihydrofuran, and the compounds may have a substituent.

The compound having a methylene group sandwiched by electron-withdrawing groups is represented by Z$^1$CH$_2$Z$^2$. Z$^1$ and Z$^2$ each represent —CN, —SO$_2$R$^{11}$, —COR$^{11}$, —COOR$^{12}$, —CONHR$^{12}$, —SO$_2$NHR$^{12}$, or —C[=C(CN)$_2$]R$^{11}$. R$^{11}$ represents an alkyl group, an aryl group, or a heterocyclic group, R$^{12}$ represents a hydrogen atom or a group R$^{11}$, and the groups may have a substituent.

Examples of the aryl groups represented by Q include a phenyl group and a naphthyl group, and the groups may have a substituent. Examples of the heterocyclic groups represented by Q include pyrrole, indole, furan, thiophene, imidazole, pyrazole, indolizine, quinoline, carbazole, phenothiazine, phenoxazine, indoline, thiazole, pyridine, pyridazine, thiadiazine, pyran, thiopyran, oxodiazole, benzoquinoline, thiadiazole, pyrrolothiazole, pyrrolopyridazine, tetrazole, oxazole, coumarin, and coumarone groups, and the groups may have a substituent.

The methine groups represented by L1, L2, and L3 may have a substituent, and the substituents thereon may be bonded to each other to form a 5- or 6-membered ring such as a cyclopentene or cyclohexene ring.

The substituents on the above groups are not particularly limited as long as they cannot act to substantially dissolve the compound of the general formula (I) to (III) in an aqueous solution having a pH of 5 to 7.

Examples of the substituents include carboxylic groups, sulfonamide groups having 1 to 10 carbon atoms (such as methanesulfonamide, benzenesulfonamide, butanesulfonamide, and n-octanesulfonamide groups), unsubstituted, alkyl-substituted, or aryl-substituted sulfamoyl groups having 0 to 10 carbon atoms (such as unsubstituted sulfamoyl, methylsulfamoyl, phenylsulfamoyl, naphthylsulfamoyl, and butylsulfamoyl groups), sulfonylcarbamoyl groups having 2 to 10 carbon atoms (such as methanesulfonylcarbamoyl, propanesulfonylcarbamoyl, and benzenesulfonylcarbamoyl groups), acylsulfamoyl groups having 1 to 10 carbon atoms (such as acetylsulfamoyl, propionylsulfamoyl, pivaloylsulfamoyl, and benzoylsulfamoyl groups), chain or cyclic alkyl groups having 1 to 8 carbon atoms (such as methyl, ethyl, isopropyl, butyl, hexyl, cyclopropyl, cyclopentyl, cyclohexyl, 2-hydroxyethyl, 4-carboxybutyl, 2-methoxyethyl, benzyl, phenethyl, 4-carboxybenzyl, and 2-diethylaminoethyl groups), alkenyl groups having 2 to 8 carbon atoms (such as vinyl and allyl groups), alkoxy groups having 1 to 8 carbon atoms (such as methoxy, ethoxy, and butoxy groups), halogen atoms (such as F, Cl, and Br), amino groups having 0 to 10 carbon atoms (such as unsubstituted amino, dimethylamino, diethylamino, and carboxyethylamino groups), ester groups having 2 to 10 carbon atoms (such as a methoxycarbonyl group), amide groups having 1 to 10 carbon atoms (such as acetylamino and benzamide groups), carbamoyl groups having 1 to 10 carbon atoms (such as unsubstituted carbamoyl, methylcarbamoyl, and ethylcarbamoyl groups), aryl groups having 6 to 10 carbon atoms (such as phenyl, naphthyl, hydroxyphenyl, 4-carboxyphenyl, 3-carboxyphenyl, 3,5-dicarboxyphenyl, 4-methanesulfonamidophenyl, and 4-butanesulfonamidophenyl groups), aryloxy groups having 6 to 10 carbon atoms (such as phenoxy, 4-carboxyphenoxy, 3-methylphenoxy, and naphthoxy groups), alkylthio groups having 1 to 8 carbon atoms (such as methylthio, ethylthio, and octylthio groups), arylthio groups having 6 to 10 carbon atoms (such as phenylthio and naphthylthio groups), acyl groups having 1 to 10 carbon atoms (such as acetyl, benzoyl, and propanoyl groups), sulfonyl groups having 1 to 10 carbon atoms (such as methanesulfonyl and benzenesulfonyl groups), ureido groups having 1 to 10 carbon atoms (such as ureido and methylureido groups), urethane groups having 2 to 10 carbon atoms (such as methoxycarbonylamino and ethoxycarbonylamino groups), a cyano group, a hydroxyl group, a nitro group, and heterocyclic groups (such as 5-carboxybenzoxazole ring, pyridine ring, sulfolane ring, pyrrole ring, pyrrolidine ring, morpholine ring, piperazine ring, pyrimidine ring, and furan ring groups).

<Solvent>

The solvent used for forming the photosensitive silver halide emulsion layer 124 is not particularly limited, and examples thereof include water, organic solvents (e.g. alcohols such as methanol, ketones such as acetone, amides such as formamide, sulfoxides such as dimethyl sulfoxide, esters such as ethyl acetate, ethers), ionic liquids, and mixtures thereof.

In this embodiment, the ratio of the solvent to the total of the silver salt, the binder, and the like in the photosensitive silver halide emulsion layer 124 is 30% to 90% by mass, preferably 50% to 80% by mass.

<Other Additives>

The additives used in this embodiment are not particularly limited, and may be preferably selected from known additives.

[Other Layers]

A protective layer (not shown) may be formed on the photosensitive silver halide emulsion layer 124. The protective layer used in this embodiment contains a binder such as a gelatin or a high-molecular polymer, and is disposed on the photosensitive silver halide emulsion layer 124 to improve the scratch prevention or mechanical property. The thickness of the protective layer is preferably 0.5 µm or less. The method of applying or forming the protective layer is not particularly limited, and may be appropriately selected from known applying or forming methods. For example, the anti-halation layer 126 may be formed below the photosensitive silver halide emulsion layer 124.

The steps for producing the conductive sheet 10 will be described below.

[Exposure]

As described above, the photosensitive material 100 having the photosensitive silver halide emulsion layer 124 on the transparent support 102 is subjected to the simultaneous both-side exposure. An electromagnetic wave may be used in the exposure. For example, the electromagnetic wave may be a light such as a visible light or an ultraviolet light, or a radiation ray such as an X-ray. The exposure may be carried out using a light source having a wavelength distribution or a specific wavelength. It is further preferred that a photomask is disposed on each side of the photosensitive material 100 and the both sides are simultaneously exposed to parallel light.

[Development Treatment]

In this embodiment, the photosensitive silver halide emulsion layer 124 is subjected to the development treatment after the exposure. Common development treatment technologies for photographic silver salt films, photographic papers, print engraving films, emulsion masks for photomasking, and the like may be used in the present invention. The developer used in the development treatment is not particularly limited, and may be a PQ developer, an MQ developer, an MAA developer, etc. Examples of commercially available developers usable in the present invention include CN-16, CR-56, CP45X, FD-3, and PAPITOL available from FUJIFILM Corporation, C-41, E-6, RA-4, D-19, and D-72 available from Eastman Kodak Company, and developers contained in kits thereof. The developer may be a lith developer.

In the present invention, the development process may include a fixation treatment for removing the silver salt in the unexposed areas to stabilize the material. Fixation treatment technologies for photographic silver salt films, photographic papers, print engraving films, emulsion masks for photomasking, and the like may be used in the present invention.

In the fixation treatment, the fixation temperature is preferably about 20° C. to 50° C., more preferably 25° C. to 45° C. The fixation time is preferably 5 seconds to 1 minute, more preferably 7 to 50 seconds. The amount of the fixer used is preferably 600 ml/m$^2$ or less, more preferably 500 ml/m$^2$ or less, particularly preferably 300 ml/m$^2$ or less, per 1 m$^2$ of the photosensitive material treated.

The developed and fixed photosensitive material is preferably subjected to a water washing treatment or a stabilization treatment. The amount of water used in the water washing or stabilization treatment is generally 20 L or less, and may be 3 L or less, per 1 m$^2$ of the photosensitive material. The water amount may be 0, and thus the photosensitive material may be washed with storage water.

The ratio of the metallic silver contained in the exposed areas after the development to the silver contained in the areas before the exposure is preferably 50% or more, more preferably 80% or more by mass. When the ratio is 50% or more by mass, a high conductivity can be achieved.

In this embodiment, the tone (gradation) obtained by the development is preferably more than 4.0, though not particularly restrictive. When the tone is more than 4.0 after the development, the conductivity of the conductive metal portion can be increased while maintaining the high transmittance of the light-transmitting portion. For example, the tone of 4.0 or more can be obtained by doping with rhodium or iridium ion.

The conductive sheet 10 is obtained by the above steps. The surface resistance of the resultant conductive sheet 10 is preferably within the range of 0.1 to 100 ohm/sq. The lower limit is preferably 1 ohm/sq or more, 3 ohm/sq or more, 5 ohm/sq or more, or 10 ohm/sq. The upper limit is preferably 70 ohm/sq or less or 50 ohm/sq or less. When the surface resistance is controlled within this range, the position detection can be performed even in a large touch panel having an area of 10 cm×10 cm or more. The conductive sheet 10 may be subjected to a calender treatment after the development to obtain a desired surface resistance.

[Physical Development Treatment and Plating Treatment]

In this embodiment, to increase the conductivity of the conductive patterns formed by the above simultaneous both-side exposure and development treatments, conductive metal particles may be deposited thereon by a physical development treatment and/or a plating treatment. In the present invention, the conductive metal particles may be deposited on the metallic silver portions by only one of the physical development and plating treatments or by the combination of the physical development and plating treatments. The conductive pattern, subjected to the physical development treatment and/or the plating treatment in this manner, is also referred to as the conductive metal portion.

In this embodiment, the physical development is such a process that metal ions such as silver ions are reduced by a reducing agent, whereby metal particles are deposited on a metal or metal compound core. Such physical development has been used in the fields of instant B & W film, instant slide film, printing plate production, etc., and the technologies can be used in the present invention. The physical development may be carried out at the same time as the above development treatment after the exposure, and may be carried out after the development treatment separately.

In this embodiment, the plating treatment may contain electroless plating such as chemical reduction plating or displacement plating. Known electroless plating technologies for printed circuit boards, etc. may be used in this embodiment. The electroless plating is preferably electroless copper plating.

[Oxidation Treatment]

In this embodiment, the conductive pattern formed by the development treatment or the conductive metal portion formed by the physical development treatment and/or the plating treatment is preferably subjected to an oxidation treatment. For example, by the oxidation treatment, a small amount of a metal deposited on the light-transmitting portion can be removed, so that the transmittance of the light-transmitting portion can be increased to approximately 100%.

[Conductive Metal Portion]

In this embodiment, the line width of each conductive pattern is preferably 1 to 20 μm, more preferably 1 to 15 μm, further preferably 5 to 10 μm, most preferably 5 to 9 μm. When the line width is less than the lower limit, the conductive pattern has an insufficient conductivity, whereby the touch panel using the conductive pattern has an insufficient detection sensitivity. On the other hand, when the line width is more than the upper limit, moire is significantly generated due to the conductive metal portion, and the touch panel using the conductive pattern has a poor visibility. When the line width is within the above range, the moire of the conductive metal portion is improved, and the visibility is remarkably improved. The line distance (the distance between the opposite sides of the small lattice 18) is preferably 30 to 500 μm, more preferably 50 to 400 μm, most preferably 100 to 350 μm. The conductive metal portion may have a part with a line width of more than 200 μm for the purpose of ground connection, etc.

In this embodiment, the opening ratio (the transmittance) of the conductive pattern is preferably 85% or more, more preferably 90% or more, most preferably 95% or more, in view of the visible light transmittance. The opening ratio is the ratio of the light-transmitting portions (other than the conductive portions of the first large lattices 16A, the first connections 22A, the first insulation patterns 34A in the first insulations 28A, the second large lattices 16B, the second connections 22B, the second insulation patterns 34B in the second insulations 28B, the small lattices 18, etc.) to the entire surface. For example, a square lattice having a line width of 15 μm and a pitch of 300 μm has an opening ratio of 90%.

[Light-Transmitting Portion]

In this embodiment, in the conductive sheet 10, the light-transmitting portions are portions having light transmittance other than the conductive patterns. As described above, the transmittance of the light-transmitting portion, which is herein a minimum transmittance value in a wavelength region of 380 to 780 nm obtained neglecting the light absorption and reflection of the transparent support 102, is 90% or more, preferably 95% or more, more preferably 97% or more, further preferably 98% or more, most preferably 99% or more.

The exposure is preferably carried out using a glass mask method or a laser lithography pattern exposure method.

[Conductive Sheet 10]

In the conductive sheet 10 of this embodiment, the thickness of the transparent support 102 is preferably 5 to 350 μm, more preferably 30 to 150 μm. When the thickness is 5 to 350 μm, a desired visible light transmittance can be obtained, and the transparent support 102 can be easily handled.

The thickness of the conductive pattern formed on the transparent support 102 may be appropriately selected by controlling the thickness of the coating of the photosensitive silver halide emulsion layer 124 applied to the transparent support 102. The thickness of the conductive pattern may be selected within a range of 0.001 to 0.2 mm, and is preferably 30 μm or less, more preferably 20 μm or less, further preferably 0.01 to 9 μm, most preferably 0.05 to 5 μm. The conductive pattern may have a monolayer structure or a multilayer structure containing two or more layers. When the conductive pattern has a multilayer structure containing two or more layers, the layers may have different wavelength color sensitivities. In this case, different patterns can be formed in the layers by using exposure lights with different wavelengths.

In the case of using the conductive sheet 10 in the touch panel, the conductive pattern preferably has a smaller thickness. As the thickness is reduced, the viewing angle and visibility of the display panel are improved. Thus, the thickness of the layer of the conductive metal on the conductive pattern is preferably less than 9 μm, more preferably 0.1 μm or more but less than 5 μm, further preferably 0.1 μm or more but less than 3 μm.

In this embodiment, the thickness of the conductive pattern can be controlled by changing the coating thickness of the photosensitive silver halide emulsion layer 124, and the thickness of the conductive metal particle layer can be controlled in the physical development treatment and/or the plating treatment, whereby the conductive sheet 10 having a thickness of less than 5 μm (preferably less than 3 μm) can be easily produced.

The plating or the like is not necessarily carried out in the method for producing the conductive sheet 10 of this embodiment. This is because the desired surface resistance can be obtained by controlling the applied silver amount and the silver/binder volume ratio of the silver salt emulsion layer in the method for producing the conductive sheet 10 of this embodiment. The calender treatment or the like may be carried out if necessary.

(Film Hardening Treatment after Development Treatment)

It is preferred that after the photosensitive silver halide emulsion layer 124 is developed, the resultant is immersed in a hardener and thus subjected to a film hardening treatment. Examples of the hardeners include dialdehydes (such as glutaraldehyde, adipaldehyde, and 2,3-dihydroxy-1,4-dioxane) and boric acid, described in Japanese Laid-Open Patent Publication No. 02-141279.

An additional functional layer such as an antireflection layer or a hard coat layer may be formed in the conductive sheet 10.

The present invention may be appropriately combined with technologies described in the following patent publications and international patent pamphlets shown in Tables 1 and 2. "Japanese Laid-Open Patent", "Publication No.", "Pamphlet No.", etc. are omitted.

TABLE 1

| | | | | |
|---|---|---|---|---|
| 2004-221564 | 2004-221565 | 2007-200922 | 2006-352073 | 2007-129205 |
| 2007-235115 | 2007-207987 | 2006-012935 | 2006-010795 | 2006-228469 |
| 2006-332459 | 2009-21153 | 2007-226215 | 2006-261315 | 2007-072171 |
| 2007-102200 | 2006-228473 | 2006-269795 | 2006-269795 | 2006-324203 |
| 2006-228478 | 2006-228836 | 2007-009326 | 2006-336090 | 2006-336099 |
| 2006-348351 | 2007-270321 | 2007-270322 | 2007-201378 | 2007-335729 |
| 2007-134439 | 2007-149760 | 2007-208133 | 2007-178915 | 2007-334325 |
| 2007-310091 | 2007-116137 | 2007-088219 | 2007-207883 | 2007-013130 |
| 2005-302508 | 2008-218784 | 2008-227350 | 2008-227351 | 2008-244067 |
| 2008-267814 | 2008-270405 | 2008-277675 | 2008-277676 | 2008-282840 |
| 2008-283029 | 2008-288305 | 2008-288419 | 2008-300720 | 2008-300721 |
| 2009-4213 | 2009-10001 | 2009-16526 | 2009-21334 | 2009-26933 |
| 2008-147507 | 2008-159770 | 2008-159771 | 2008-171568 | 2008-198388 |
| 2008-218096 | 2008-218264 | 2008-224916 | 2008-235224 | 2008-235467 |
| 2008-241987 | 2008-251274 | 2008-251275 | 2008-252046 | 2008-277428 |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

EXAMPLES

The present invention will be described more specifically below with reference to Examples. Materials, amounts, ratios, treatment contents, treatment procedures, and the like, used in Examples, may be appropriately changed without departing from the scope of the present invention. The following specific examples are therefore to be considered in all respects as illustrative and not restrictive.

First Example

In Examples 1 to 7 and Comparative Examples 1 and 2, the applied silver amount of the first photosensitive silver halide emulsion layer 124a formed on one main surface of the transparent support 102 and the second photosensitive silver halide emulsion layer 124b formed on the other main surface of the transparent support 102 was changed to evaluate state of the simultaneous both-side exposure. It should be noted that the antihalation layers were not formed.

Example 1

Photosensitive Silver Halide Material

An emulsion containing an aqueous medium, a gelatin, and silver iodobromochloride particles was prepared. The amount of the gelatin was 10.0 g per 150 g of Ag, and the silver iodobromochloride particles had an I content of 0.2 mol %, a Br content of 40 mol %, and an average spherical equivalent diameter of 0.1 μm.

$K_3Rh_2Br_9$ and $K_2IrCl_6$ were added to the emulsion at a concentration of $10^{-7}$ mol/mol-silver to dope the silver bromide particles with Rh and Ir ions. $Na_2PdCl_4$ was further added to the emulsion, and the resultant emulsion was subjected to gold-sulfur sensitization using chlorauric acid and sodium thiosulfate. The emulsion and a gelatin hardening agent were applied to both sides of a transparent support 102 composed of a polyethylene terephthalate (PET). The amount of the applied silver salt in the silver density (the applied silver amount) was 7 g/m², and the Ag/gelatin volume ratio was 2/1.

The PET support had a width of 30 cm, and the emulsion was applied thereto into a width of 25 cm and a length of 20 m. The both edge portions having a width of 3 cm were cut off to obtain a roll photosensitive silver halide material having a width of 24 cm.

(Exposure)

Figure 19A:
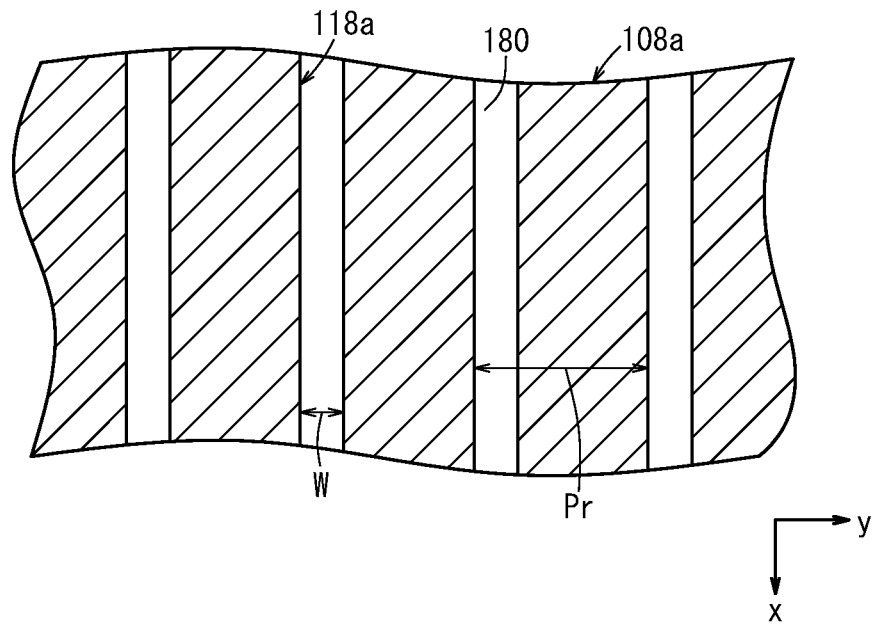
FIGS. 19A and 19B are explanatory views showing exposure patterns of first and second photomasks used in First and Second Examples respectively.
Figure 19B:
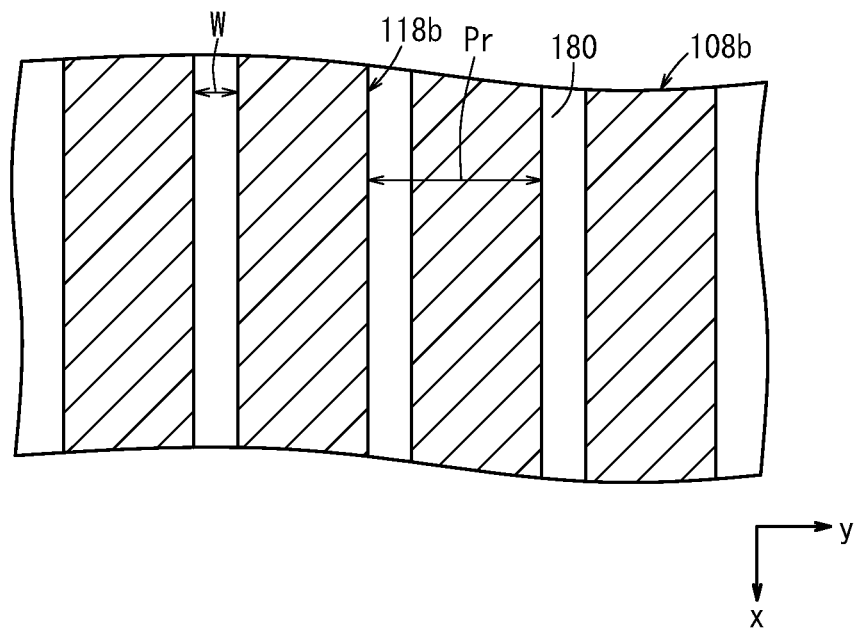

As shown in FIGS. 19A and 19B, a first exposure pattern 118a of a first photomask 108a and a second exposure pattern 118b of a second photomask 108b for simultaneous both-side exposure were such that slits 180 each having a width W of 10 μm extended in the first direction (the x direction) and a large number of straight lines were arranged in the second direction (the y direction) at a pitch Pr of 100 μm. The slits 180 of the first exposure pattern 118a were displaced by Pr/2 from those of the second exposure pattern 118b. Therefore, patterns formed by the simultaneous both-side exposure on a first photosensitive silver halide emulsion layer 124a was displaced by Pr/2 from those on a second photosensitive silver halide emulsion layer 124b. The photosensitive material was exposed to parallel light from a light source of a high-pressure mercury lamp through the first photomask 108a having the first exposure pattern 118a and the second photomask 108b having the second exposure pattern 118b. In the exposure, a neutral density filter (an ND filter) having a density of 1.2 was used.

(Development Treatment)

Formulation of 1 L of Developer

| | |
|---|---|
| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| pH | Controlled at 10.3 |

Formulation of 1 L of Fixer

| | |
|---|---|
| Ammonium thiosulfate solution (75%) | 300 ml |
| Ammonium sulfite monohydrate | 25 g |
| 1,3-Diaminopropanetetraacetic acid | 8 g |
| Acetic acid | 5 g |
| Aqueous ammonia (27%) | 1 g |
| pH | Controlled at 6.2 |

The exposed photosensitive material was treated with the above treatment agents under the following development treatment conditions using an automatic processor FG-710PTS manufactured by FUJIFILM Corporation. A development treatment was carried out at 35° C. for 30 seconds, a fixation treatment was carried out at 34° C. for 23 seconds, and then a water washing treatment was carried out for 20 seconds at a water flow rate of 5 L/min. A conductive sheet having a large number of conductive patterns on each side of the transparent support was produced by the development treatment. The conductive patterns had an arrangement pitch of 100 μm, a thickness of 2 μm, and a line width of 10 μm. This conductive sheet was denoted by sample 1.

A conductive sheet having a large number of conductive patterns (with an arrangement pitch of 200 μm, a thickness of 2 μm, and a line width of 10 μm) on each side of the transparent support was produced in the same manner except that the simultaneous both-side exposure and the development treatment were carried out using a first exposure pattern 118a and a second exposure pattern 118b having a pitch Pr of 200 μm (see FIGS. 19A and 19B). This conductive sheet was denoted by sample 2.

A conductive sheet having a large number of conductive patterns (with an arrangement pitch of 300 μm, a thickness of 2 μm, and a line width of 10 μm) on each side of the transparent support was produced in the same manner except that the simultaneous both-side exposure and the development treatment were carried out using a first exposure pattern 118a and a second exposure pattern 118b having a pitch Pr of 300 μm (see FIGS. 19A and 19B). This conductive sheet was denoted by sample 3.

Example 2

Samples 1 to 3 of Example 2 were produced in the same manner as Example 1 except that the first photosensitive silver halide emulsion layer 124a and the second photosensitive silver halide emulsion layer 124b each had an applied silver amount (the silver density) of 7.8 g/m$^2$.

Example 3

Samples 1 to 3 of Example 3 were produced in the same manner as Example 1 except that the first photosensitive silver halide emulsion layer 124a and the second photosensitive silver halide emulsion layer 124b each had an applied silver amount (the silver density) of 9.0 g/m$^2$.

Example 4

Samples 1 to 3 of Example 4 were produced in the same manner as Example 1 except that the first photosensitive silver halide emulsion layer 124a and the second photosensitive silver halide emulsion layer 124b each had an applied silver amount (the silver density) of 10.0 g/m$^2$.

Example 5

Samples 1 to 3 of Example 5 were produced in the same manner as Example 1 except that the first photosensitive silver halide emulsion layer 124a and the second photosensitive silver halide emulsion layer 124b each had an applied silver amount (the silver density) of 15.0 g/m$^2$.

Example 6

Samples 1 to 3 of Example 6 were produced in the same manner as Example 1 except that the first photosensitive silver halide emulsion layer 124a and the second photosensitive silver halide emulsion layer 124b each had an applied silver amount (the silver density) of 20.0 g/m$^2$.

Example 7

Samples 1 to 3 of Example 7 were produced in the same manner as Example 1 except that the first photosensitive silver halide emulsion layer 124a and the second photosensitive silver halide emulsion layer 124b each had an applied silver amount (the silver density) of 30.0 g/m$^2$.

Comparative Example 1

Samples 1 to 3 of Comparative Example 1 were produced in the same manner as Example 1 except that the first photosensitive silver halide emulsion layer 124a and the second photosensitive silver halide emulsion layer 124b each had an applied silver amount (the silver density) of 2.0 g/m$^2$.

Comparative Example 2

Samples 1 to 3 of Comparative Example 2 were produced in the same manner as Example 1 except that the first photosensitive silver halide emulsion layer 124a and the second photosensitive silver halide emulsion layer 124b each had an applied silver amount (the silver density) of 31.0 g/m$^2$.

<Evaluation>

In the simultaneous both-side exposure, when a scattered light generated from a second light 106b of a second light source 110b reaches a first photosensitive layer 104a formed on one main surface of a transparent support 102 as shown in FIG. 4, a large area of the boundary between the first photosensitive layer 104a and the transparent support 102 is exposed, thereby to form a latent image 120. As a result, as shown in FIG. 5, thin conductive layers 122 are formed in the first conductive layer 116a due to the second light 106b from the second light source 110b. In this case, the distance between the adjacent patterns in the first conductive layer 116a is substantively reduced, whereby the insulation resistance value therebetween is lowered.

Therefore; a standard sample was produced, the insulation resistance value between the adjacent conductive patterns of the standard sample was measured, and the reduction in the insulation resistance value of a sample from the measured value of the standard sample was determined to evaluate state of the simultaneous both-side exposure.

(Production of Evaluation Standard Sample)

A photosensitive silver halide material was prepared in the same manner as Example 1 except that a photosensitive silver halide emulsion layer 124 was formed only on one main surface of the transparent support 102. The emulsion layer 124 was subjected to a single-side exposure using the first photomask 108a and to the development treatment, whereby evaluation standard sample 1 having a large number of conductive patterns (having an arrangement pitch of 100 μm) only on the one main surface of the transparent support 102 was produced. Evaluation standard sample 2 (having an arrangement pitch of 200 μm) and evaluation standard sample 3 (having an arrangement pitch of 300 μm) were produced in the same manner.

Then, ten points for measurement of the insulation resistance between the adjacent conductive patterns of the evaluation standard sample 1 were selected, the insulation resistances of the ten points were measured by an insulation resistance meter, and the average of the measured resistances was determined as the insulation resistance value of the evaluation standard sample 1. The insulation resistance values of the evaluation standard samples 2 and 3 were determined in the same manner as the evaluation standard sample 1.

(Evaluation Method)

Ten points for measurement of the insulation resistance between the adjacent conductive patterns of the sample 1 of Example 1 were selected, the insulation resistances of the ten points were measured by the insulation resistance meter, and the average of the measured resistances was determined as the insulation resistance value of the sample 1 of Example 1. The insulation resistance values of the samples 2 and 3 of Example 1 were determined in the same manner. Furthermore, the insulation resistance values of the samples 1 to 3 of Examples 2 to 7 and Comparative Examples 1 and 2 were determined in the same manner.

The insulation resistance values were evaluated as follows:
(a) when the insulation resistance values of the samples 1 to 3 of an example were reduced by less than 1% from those of the corresponding evaluation standard samples 1 to 3, the example was evaluated as "Excellent";
(b) when the insulation resistance values of the samples 1 to 3 of an example were reduced by 2% or more but less than 3% from those of the corresponding evaluation standard samples 1 to 3, the example was evaluated as "Good";
(c) when the insulation resistance values of one or two of the samples 1 to 3 of an example were reduced by 3% or more from those of the corresponding evaluation standard samples 1 to 3 (for example, the insulation resistance values of the samples 2 and 3 of an example were reduced by less than 3% from those of the corresponding evaluation standard samples 2 and 3, but the insulation resistance value of the sample 1 of the example was reduced by 3% or more from that of the corresponding evaluation standard sample 1), the example was evaluated as "Fair"; and
(d) when the insulation resistance values of the samples 1 to 3 of an example were reduced by 3% or more from those of the corresponding evaluation standard samples 1 to 3, the example was evaluated as "Poor";
(Evaluation Result)

As shown in Table 3, in Examples 1 to 7, the reductions from the insulation resistance values of the corresponding evaluation standard samples were less than 3%. Particularly in Examples 4 to 6, the reductions from the values of the corresponding evaluation standard samples were less than 1%. The results indicated that the thin conductive layer 122 was hardly formed in the conductive patterns, and the simultaneous both-side exposure was successfully carried out.

In contrast, in Comparative Example 1, the reductions from the insulation resistance values of the corresponding evaluation standard samples were 3% or more. The results indicated that the thin conductive layer, which acted to reduce the insulation resistance values by 3% or more, was formed in the conductive patterns, and the simultaneous both-side exposure was not successfully carried out.

In Comparative Example 2, in the samples 1 and 2 having arrangement pitches of 100 and 200 μm respectively, the reductions from the insulation resistance values of the corresponding evaluation standard samples were 3% or more. The results indicated that the simultaneous both-side exposure was poor in repeatability and could not be reliably carried out.

TABLE 3

|  | Applied silver amount (g/m$^2$) | Neutral density filter (Density) | Evaluation |
|---|---|---|---|
| Comp. Ex. 1 | 2.0 | 1.2 | Poor |
| Ex. 1 | 7.0 | 1.2 | Good |
| Ex. 2 | 7.8 | 1.2 | Good |
| Ex. 3 | 9.0 | 1.2 | Good |
| Ex. 4 | 10.0 | 1.2 | Excellent |
| Ex. 5 | 15.0 | 1.2 | Excellent |
| Ex. 6 | 20.0 | 1.2 | Excellent |
| Ex. 7 | 30.0 | 1.2 | Good |
| Comp. Ex. 2 | 31.0 | 1.2 | Fair |

Second Example

In Examples 11 to 20, the light absorbance of the coloring matter contained in the first photosensitive silver halide emulsion layer 124a formed on one main surface of the transparent support 102 and the second photosensitive silver halide emulsion layer 124b formed on the other main surface of the transparent support 102 (the amount of the light-absorbing dye added to the layers) was changed thereby to evaluate state of the simultaneous both-side exposure.

Example 11

Samples 1 to 3 of Example 11 were produced in the same manner as Example 1 except that the applied silver amount (the silver density) was 7 g/m$^2$, and the following light-absorbing dye was added to the photosensitive silver halide emulsion layers, so that the coloring matter in the layers exhibited a light absorbance of 0.1 (no unit).
(Composition or Type of Light-Absorbing Dye)

A solid particle dispersion of a dye represented by the general formula (I) described in claim 1 of Japanese Laid-Open Patent Publication No. 2007-199703 was used.

Example 12

Samples 1 to 3 of Example 12 were produced in the same manner as Example 11 except that the light-absorbing dye was added to the photosensitive silver halide emulsion layers, so that the coloring matter in the layers exhibited a light absorbance of 0.2 (no unit).

Example 13

Samples 1 to 3 of Example 13 were produced in the same manner as Example 11 except that the light-absorbing dye was added to the photosensitive silver halide emulsion layers, so that the coloring matter in the layers exhibited a light absorbance of 0.8 (no unit).

Example 14

Samples 1 to 3 of Example 14 were produced in the same manner as Example 11 except that the light-absorbing dye was added to the photosensitive silver halide emulsion layers, so that the coloring matter in the layers exhibited a light absorbance of 1.4 (no unit).

Example 15

Samples 1 to 3 of Example 15 were produced in the same manner as Example 11 except that the light-absorbing dye was added to the photosensitive silver halide emulsion layers, so that the coloring matter in the layers exhibited a light absorbance of 1.5 (no unit).

Examples 16 to 20

Samples 1 to 3 of Examples 16 to 20 were produced in the same manner as Examples 11 to 15 respectively except that the applied silver amount (the silver density) was 5 g/m$^2$.
<Evaluation>

Evaluation was carried out in the same manner as First Example.
(Evaluation Result)

As shown in Table 4, in Examples 11 to 20, the reductions from the insulation resistance values of the corresponding evaluation standard samples were less than 3%. Particularly in Examples 13 and 18, the reductions from the values of the corresponding evaluation standard samples were less than 1%. The results indicated that the thin conductive layer 122 was hardly formed in the conductive patterns, and the simultaneous both-side exposure was successfully carried out.

TABLE 4

|  | Applied silver amount (g/m$^2$) | Light absorbance of coloring matter (no unit) | Neutral density filter (Density) | Evaluation |
|---|---|---|---|---|
| Ex. 11 | 7.0 | 0.1 | 1.2 | Good |
| Ex. 12 | 7.0 | 0.2 | 1.2 | Good |
| Ex. 13 | 7.0 | 0.8 | 1.2 | Excellent |
| Ex. 14 | 7.0 | 1.4 | 1.2 | Good |
| Ex. 15 | 7.0 | 1.5 | 1.2 | Good |
| Ex. 16 | 5.0 | 0.1 | 1.2 | Good |
| Ex. 17 | 5.0 | 0.2 | 1.2 | Good |
| Ex. 18 | 5.0 | 0.8 | 1.2 | Excellent |
| Ex. 19 | 5.0 | 1.4 | 1.2 | Good |
| Ex. 20 | 5.0 | 1.5 | 1.2 | Good |

Third Example

In Examples 21 to 31, the first photosensitive layer 104a contained the first photosensitive silver halide emulsion layer 124a and the first antihalation layer 126a formed between the emulsion layer 124a and the transparent support 102, and the second photosensitive layer 104b contained the second photosensitive silver halide emulsion layer 124b and the second antihalation layer 126b formed between the emulsion layer 124b and the transparent support 102. In the examples, the applied silver amount of the first photosensitive silver halide emulsion layer 124a and the second photosensitive silver halide emulsion layer 124b was changed, and the light absorbance of the coloring matter contained in the first antihalation layer 126a and the second antihalation layer 126b (the amount of the light-absorbing dye added to the layers) was changed, thereby to evaluate state of the simultaneous both-side exposure.

The following solid dispersion dye A and water-soluble dye B were used as the light-absorbing dye.

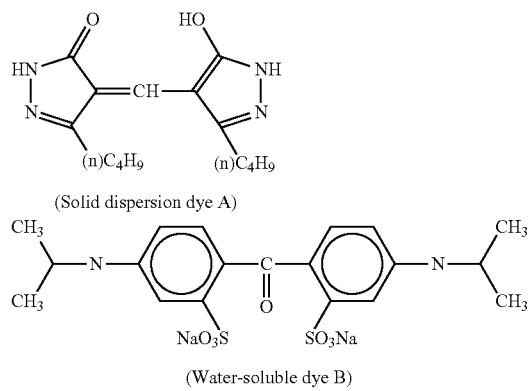

(Solid dispersion dye A)

(Water-soluble dye B)

Example 21

Samples 1 to 3 of Example 21 were produced in the same manner as Example 1 except that a first antihalation layer 126a was formed between the first photosensitive silver halide emulsion layer 124a and the transparent support 102, a second antihalation layer 126b was formed between the second photosensitive silver halide emulsion layer 124b and the transparent support 102, the first emulsion layer 124a and the second emulsion layer 124b each had an applied silver amount (a silver density) of 5 g/m$^2$, and 100 mg/m$^2$ of the solid dispersion dye A was applied to each of the first antihalation layer 126a and the second antihalation layer 126b. The dye exhibited a light absorbance of 0.75 in the antihalation layers. The light absorbance of the dye was measured on another sample having only an antihalation layer at a wavelength of 420 nm, which is the photosensitive wavelength of the silver halide.

Example 22

Samples 1 to 3 of Example 22 were produced in the same manner as Example 21 except that the first photosensitive silver halide emulsion layer 124a and the second photosensitive silver halide emulsion layer 124b each had an applied silver amount (a silver density) of 6 g/m$^2$.

Example 23

Samples 1 to 3 of Example 23 were produced in the same manner as Example 21 except that the first photosensitive silver halide emulsion layer 124a and the second photosensitive silver halide emulsion layer 124b each had an applied silver amount (a silver density) of 8 g/m$^2$.

Example 24

Samples 1 to 3 of Example 24 were produced in the same manner as Example 21 except that 70 mg/m$^2$ of the solid dispersion dye A was applied to each of the first antihalation layer 126a and the second antihalation layer 126b, and the dye exhibited a light absorbance of 0.52 in the antihalation layers.

Example 25

Samples 1 to 3 of Example 25 were produced in the same manner as Example 24 except that the first photosensitive silver halide emulsion layer 124a and the second photosensitive silver halide emulsion layer 124b had an applied silver amount (a silver density) of 6 g/m$^2$.

Example 26

Samples 1 to 3 of Example 26 were produced in the same manner as Example 24 except that the first photosensitive silver halide emulsion layer 124a and the second photosensitive silver halide emulsion layer 124b had an applied silver amount (a silver density) of 8 g/m$^2$.

Example 27

Samples 1 to 3 of Example 27 were produced in the same manner as Example 21 except that the first photosensitive silver halide emulsion layer 124a and the second photosensitive silver halide emulsion layer 124b had an applied silver amount (a silver density) of 15 g/m$^2$, 0 mg/m$^2$ of the solid dispersion dye A was applied to the first antihalation layer 126a and the second antihalation layer 126b, and the dye exhibited a light absorbance of 0 in the antihalation layers.

Example 28

Samples 1 to 3 of Example 28 were produced in the same manner as Example 21 except that the first photosensitive silver halide emulsion layer 124a and the second photosensitive silver halide emulsion layer 124b each had an applied silver amount (a silver density) of 6 g/m$^2$, 100 mg/m$^2$ of the solid dispersion dye A was applied to each of the first antihalation layer 126a and the second antihalation layer 126b, 50 mg/m$^2$ of the water-soluble dye B was applied to each of the antihalation layers, and the dyes exhibited a light absorbance of 0.9 in the antihalation layers.

Example 29

Samples 1 to 3 of Example 29 were produced in the same manner as Example 28 except that 100 mg/m$^2$ of the water-soluble dye B was applied to each of the first antihalation layer 126a and the second antihalation layer 126b, and the dyes exhibited a light absorbance of 1.0 in the antihalation layers.

Example 30

Samples 1 to 3 of Example 30 were produced in the same manner as Example 29 except that the first photosensitive silver halide emulsion layer 124a and the second photosensitive silver halide emulsion layer 124b each had an applied silver amount (a silver density) of 15 g/m$^2$.

Example 31

Samples 1 to 3 of Example 31 were produced in the same manner as Example 29 except that the first photosensitive silver halide emulsion layer 124a and the second photosensitive silver halide emulsion layer 124b each had an applied silver amount (a silver density) of 3 g/m$^2$.

Example 32

Samples 1 to 3 of Example 32 were produced in the same manner as Example 1 in First Example except that the first photosensitive silver halide emulsion layer 124a and the second photosensitive silver halide emulsion layer 124b each had an applied silver amount (a silver density) of 8 g/m$^2$.

Comparative Example 21

Samples 1 to 3 of Comparative Example 21 were produced in the same manner as Example 1 in First Example except that the first photosensitive silver halide emulsion layer 124a and the second photosensitive silver halide emulsion layer 124b each had an applied silver amount (a silver density) of 5 g/m$^2$.

Comparative Example 22

Samples 1 to 3 of Comparative Example 22 were produced in the same manner as Example 1 in First Example except that the first photosensitive silver halide emulsion layer 124a and the second photosensitive silver halide emulsion layer 124b each had an applied silver amount (a silver density) of 6 g/m$^2$.

<Evaluation>

Evaluation was carried out in the same manner as First Example.

(Evaluation Result)

As shown in Table 5, in Examples 21 to 32, the reductions from the insulation resistance values of the corresponding evaluation standard samples were less than 3%. Particularly in Examples 23 and 26 to 30, the reductions from the values of the corresponding evaluation standard samples were less than 1%. The results indicated that the thin conductive layer 122 was hardly formed in the conductive patterns, and the simultaneous both-side exposure was successfully carried out.

TABLE 5

| | Antihalation layer | | | | | |
|---|---|---|---|---|---|---|
| | Applied silver amount (g/m$^2$) | Formed or Not formed | Applied dye compound A amount (mg/m$^2$) | Applied dye compound B amount (mg/m$^2$) | Light absorbance of dye (no unit) | Evaluation |
| Ex. 21 | 5 | Formed | 100 | — | 0.75 | Good |
| Ex. 22 | 6 | Formed | 100 | — | 0.75 | Good |
| Ex. 23 | 8 | Formed | 100 | — | 0.75 | Excellent |
| Ex. 24 | 5 | Formed | 70 | — | 0.52 | Good |
| Ex. 25 | 6 | Formed | 70 | — | 0.52 | Good |
| Ex. 26 | 8 | Formed | 70 | — | 0.52 | Excellent |
| Ex. 27 | 15 | Formed | 0 | — | 0 | Excellent |
| Ex. 28 | 6 | Formed | 100 | 50 | 0.9 | Excellent |
| Ex. 29 | 6 | Formed | 100 | 100 | 1.0 | Excellent |
| Ex. 30 | 15 | Formed | 100 | 100 | 1.0 | Excellent |
| Ex. 31 | 3 | Formed | 100 | 100 | 1.0 | Good |
| Ex. 32 | 8 | Not formed | — | — | — | Good |
| Comp. Ex. 21 | 5 | Not formed | — | — | — | Fair |
| Comp. Ex. 22 | 6 | Not formed | — | — | — | Fair |

It is to be understood that the conductive sheet production method and the touch panel production method of the present invention are not limited to the above embodiments, and various changes and modifications may be made therein without departing from the scope of the present invention.

What is claimed is:

1. A method for producing a conductive sheet comprising:
   exposing and developing a photosensitive material having a transparent support, a first photosensitive layer formed on one main surface of the transparent support, and a second photosensitive layer formed on the other main surface of the transparent support, wherein
   said exposing includes a first exposure treatment for irradiating the first photosensitive layer on the transparent support from a side of the first photosensitive layer with a light thereby to expose the first photosensitive layer and a second exposure treatment for irradiating the second photosensitive layer on the transparent support from a side of the second photosensitive layer with a light thereby to expose the second photosensitive layer, and
   said exposing is performed such that the light incident on the first photosensitive layer does not substantially reach the second photosensitive layer and the light incident on the second photosensitive layer does not substantially reach the first photosensitive layer.

2. The method according to claim 1, wherein
   the first exposure treatment for the first photosensitive layer and the second exposure treatment for the second photosensitive layer are simultaneously carried out.

3. The method according to claim 1, wherein
an image formation on the first photosensitive layer is controlled at least by selecting the sensitivity of the second photosensitive layer, and
an image formation on the second photosensitive layer is controlled at least by selecting the sensitivity of the first photosensitive layer.

4. The method according to claim 3, wherein
the first photosensitive layer contains a material having a light absorption sensitivity in the wavelength range of the light incident thereon, and
the second photosensitive layer contains a material having a light absorption sensitivity in the wavelength range of the light incident thereon.

5. The method according to claim 3, wherein
the first photosensitive layer contains a first photosensitive silver halide emulsion layer,
the second photosensitive layer contains a second photosensitive silver halide emulsion layer,
the image formation on the first photosensitive layer is controlled at least by selecting an applied silver amount of the second photosensitive silver halide emulsion layer, and
the image formation on the second photosensitive layer is controlled at least by selecting an applied silver amount of the first photosensitive silver halide emulsion layer.

6. The method according to claim 3, wherein
the first photosensitive layer contains a first photosensitive silver halide emulsion layer,
the second photosensitive layer contains a second photosensitive silver halide emulsion layer,
the image formation on the first photosensitive layer is controlled at least by selecting a light absorbance of a coloring matter contained in the second photosensitive silver halide emulsion layer, and
the image formation on the second photosensitive layer is controlled at least by selecting a light absorbance of a coloring matter contained in the first photosensitive silver halide emulsion layer.

7. The method according to claim 3, wherein
the first photosensitive layer contains a first photosensitive silver halide emulsion layer,
the second photosensitive layer contains a second photosensitive silver halide emulsion layer,
the image formation on the first photosensitive layer is controlled at least by selecting an applied silver amount of the second photosensitive silver halide emulsion layer and a light absorbance of a coloring matter contained in the second photosensitive silver halide emulsion layer, and
the image formation on the second photosensitive layer is controlled at least by selecting an applied silver amount of the first photosensitive silver halide emulsion layer and a light absorbance of a coloring matter contained in the first photosensitive silver halide emulsion layer.

8. The method according to claim 5, wherein
no antihalation layers are provided, and
the first photosensitive silver halide emulsion layer and the second photosensitive silver halide emulsion layer each have an applied silver amount of 5 to 30 g/m$^2$.

9. The method according to claim 3, wherein
the first photosensitive layer contains a first photosensitive silver halide emulsion layer and a first antihalation layer formed between the first photosensitive silver halide emulsion layer and the transparent support,
the second photosensitive layer contains a second photosensitive silver halide emulsion layer and a second antihalation layer formed between the second photosensitive silver halide emulsion layer and the transparent support,
the image formation on the first photosensitive layer is controlled at least by selecting a light absorbance of a coloring matter contained in each of the first and second antihalation layers, and
the image formation on the second photosensitive layer is controlled at least by selecting a light absorbance of a coloring matter contained in each of the first and second antihalation layers.

10. The method according to claim 3, wherein
the first photosensitive layer contains a first photosensitive silver halide emulsion layer and a first antihalation layer formed between the first photosensitive silver halide emulsion layer and the transparent support,
the second photosensitive layer contains a second photosensitive silver halide emulsion layer and a second antihalation layer formed between the second photosensitive silver halide emulsion layer and the transparent support,
the image formation on the first photosensitive layer is controlled at least by selecting an applied silver amount of the second photosensitive silver halide emulsion layer and a light absorbance of a coloring matter contained in each of the first and second antihalation layers, and
the image formation on the second photosensitive layer is controlled at least by selecting an applied silver amount of the first photosensitive silver halide emulsion layer and a light absorbance of a coloring matter contained in each of the first and second antihalation layers.

11. The method according to claim 9, wherein
the first photosensitive silver halide emulsion layer and the second photosensitive silver halide emulsion layer each have an applied silver amount of 3 to 30 g/m$^2$.

12. The method according to claim 9, wherein
the first photosensitive silver halide emulsion layer and the second photosensitive silver halide emulsion layer each have an applied silver amount of less than 15 g/m$^2$, and
the first antihalation layer and the second antihalation layer each have an applied coloring matter amount of 50 to 250 mg/m$^2$.

13. The method according to claim 12, wherein
the first antihalation layer and the second antihalation layer each have an applied coloring matter amount of 70 to 200 mg/m$^2$.

14. The method according to claim 6, wherein
the coloring matter has a light absorbance of 0.1 to 1.5 (no unit).

15. A method for producing a touch panel containing a conductive sheet, wherein the conductive sheet has a transparent support, a first conductive layer formed on one main surface of the transparent support, and a second conductive layer formed on the other main surface of the transparent support, comprising:
exposing a photosensitive material having the transparent support, a first photosensitive layer formed on the one main surface of the transparent support, and a second photosensitive layer formed on the other main surface of the transparent support; and
developing the exposed photosensitive material thereby to make the first photosensitive layer and the second photosensitive layer into the first conductive layer and the second conductive layer respectively,
wherein said exposing includes a first exposure treatment for irradiating the first photosensitive layer on the transparent support with a light thereby to expose the first photosensitive layer and a second exposure treatment for irradiating the second photosensitive layer on the transparent support with a light thereby to expose the second photosensitive layer, and said exposing is performed such that the light incident on the first photosensitive layer does not substantially reach the second photosensitive layer and the light incident on the second photosensitive layer does not substantially reach the first photosensitive layer, wherein the first conductive layer has a plurality of first conductive patterns arranged in a first direction and a plurality of first terminal wiring patterns connected to the first conductive patterns, the second conductive layer has a plurality of second conductive patterns arranged in a second direction perpendicular to the first direction and a plurality of second terminal wiring patterns connected to the second conductive patterns, and the first conductive patterns and the second conductive patterns are alternately arranged in a sensing region, the first terminal wiring patterns are arranged in a first terminal wiring region, and the second terminal wiring patterns are arranged in a second terminal wiring region.

16. The method according to claim 15, further comprising bending the first terminal wiring region and the second terminal wiring region toward the back side of the sensing region.

17. The method according to claim 16, wherein in the first terminal wiring region, the length of a portion in which the first terminal wiring patterns extend to the outside is smaller than the length of a portion in which the first terminal wiring patterns are connected to the first conductive patterns, and the first terminal wiring patterns corresponding to both the left and right first conductive patterns that are farthest from the center of the arrangement of the first conductive patterns have approximately the same lengths, and in the second terminal wiring region, the length of a portion in which the second terminal wiring patterns extend to the outside is smaller than the length of a portion in which the second terminal wiring patterns are connected to the second conductive patterns, and the second terminal wiring patterns corresponding to both the left and right second conductive patterns that are farthest from the center of the arrangement of the second conductive patterns have approximately the same lengths.

18. The method according to claim 15, wherein the first conductive patterns each contain two or more first conductive large lattices and a first connection for electrically connecting the adjacent first large lattices, the second conductive patterns each contain two or more second conductive large lattices and a second connection for electrically connecting the adjacent second large lattices, the first large lattices and the second large lattices each contain a combination of two or more small lattices, the first conductive patterns and the second conductive patterns each have a line width of 1 to 20 μm, and the small lattices each have a side length of 50 to 500 μm.

* * * * *